United States Patent
Kawai

(10) Patent No.: US 10,892,749 B2
(45) Date of Patent: Jan. 12, 2021

(54) ELECTRONIC CIRCUIT, METHOD, AND NON-TRANSITORY RECORDING MEDIUM

(71) Applicant: Kabushiki Kaisha Toshiba, Minato-ku (JP)

(72) Inventor: Shusuke Kawai, Fujisawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 16/551,812

(22) Filed: Aug. 27, 2019

(65) Prior Publication Data

US 2020/0287533 A1    Sep. 10, 2020

(30) Foreign Application Priority Data

Mar. 5, 2019 (JP) .................. 2019-039879

(51) Int. Cl.
  *H03K 17/08* (2006.01)
  *H03K 17/16* (2006.01)

(52) U.S. Cl.
  CPC ........... *H03K 17/165* (2013.01); *H03K 17/08* (2013.01); *H03K 2017/0806* (2013.01)

(58) Field of Classification Search
  CPC ................. H03K 17/165; H03K 17/08; H03K 2017/0806
  USPC .......................... 327/108, 109, 110, 111, 112
  See application file for complete search history.

(56) References Cited

U.S. PATENT DOCUMENTS

| | | | |
|---|---|---|---|
| 8,497,728 B2 * | 7/2013 | Mizobe | ................. H02P 29/02 326/83 |
| 9,184,744 B2 | 11/2015 | Kreuter et al. | |
| 2016/0352319 A1 * | 12/2016 | Nagase | ................. H03K 17/687 |

OTHER PUBLICATIONS

Blank, M, et al., "Digital Slew Rate and S-Shape Control for Smart Power Switches to Reduce EMI Generation", IEEE Transactions on Power Electronics, vol. 30, No. 9, 2015, pp. 5170-5180.

* cited by examiner

*Primary Examiner* — John W Poos
(74) *Attorney, Agent, or Firm* — Oblon, McClelland, Maier & Neustadt, L.L.P.

(57) ABSTRACT

An electronic circuit of the embodiments includes at least one first n-type transistor, at least one first p-type transistor, a supply circuit, a detection circuit, and a control circuit. The supply supplies current to a control terminal of a semiconductor switching element. The detection circuit acquires a value associated with a voltage at a first terminal of the semiconductor switching element. The control circuit causes one type of transistors of the first n-type transistors and the first p-type transistors to be in the non-driven state and causing at least one of the other type of transistors to be in the driven state, at least based on the value associated with the voltage. The first n-type transistor is electrically connected to a reference potential and the control terminal, and the first p-type transistor is electrically connected to a power supply potential and the control terminal.

16 Claims, 18 Drawing Sheets

ELECTRONIC CIRCUIT, METHOD, AND NON-TRANSITORY RECORDING MEDIUM

CROSS-REFERENCE TO RELATED APPLICATION (S)

This application is based upon and claims the benefit of priority from Japanese Patent Application No. 2019-039879, filed Mar. 5, 2019; the entire contents of which are incorporated herein by reference.

FIELD

Embodiments described herein relate generally to an electronic circuit, a method, and a non-transitory recording medium.

BACKGROUND

In a semiconductor switching element, an electronic circuit is desired that is capable of both suppressing conductive noise and radiation noise (countermeasure against EMI (Electromagnetic Interference)) and reducing a switching loss.

DETAILED DESCRIPTION

A problem to be solved by embodiments of the present invention is to provide an electronic circuit, a method, and a program that are capable of both suppressing noise and reducing a loss, in a semiconductor switching element.

In order to solve the problem, an electronic circuit of the embodiments is an electronic circuit configured to switch the state of a semiconductor switching element between a driven state and a non-driven state, the electronic circuit including a current supply circuit, a detection circuit, and a control circuit. The current supply circuit includes at least one first n-type transistor, and at least one first p-type transistor, and is configured to supply a current to a control terminal of this semiconductor switching element. The detection circuit acquires a value associated with a voltage at a first terminal different from the control terminal of the semiconductor switching element. The control circuit causes one type of transistors of the first n-type transistors and the first p-type transistors to be in the non-driven state and causes at least one of the other type of transistors to be in the driven state, at least based on the value associated with the voltage. The first n-type transistor is electrically connected to a reference potential and the control terminal, and the first p-type transistor is electrically connected to a power supply potential and the control terminal.

Below, a description is given of embodiments of the present invention with reference to the drawings. The present invention is not limited to the embodiments.

First Embodiment

Figure 1:
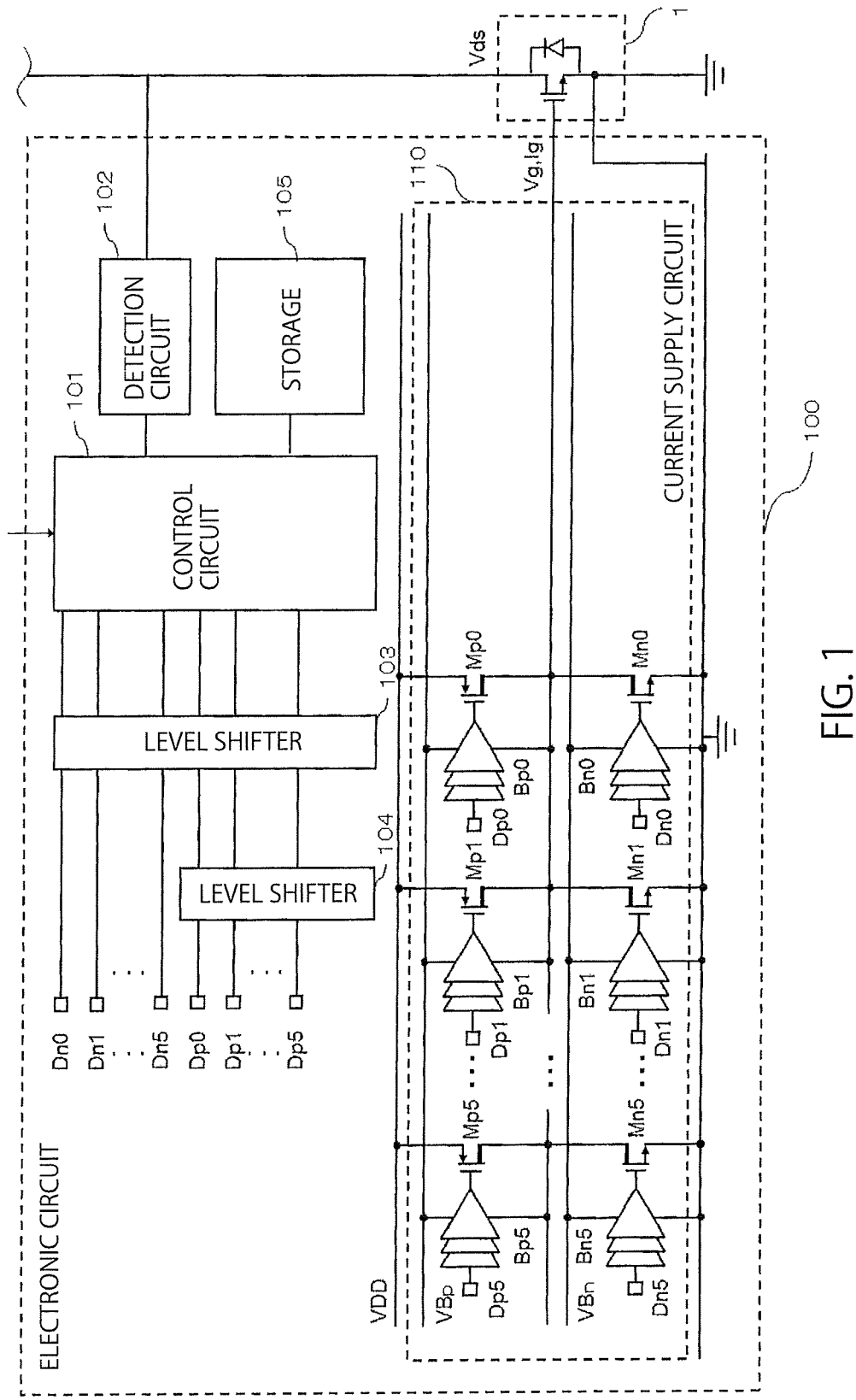
FIG. 1 is a driving system diagram illustrating a configuration of an electronic circuit 100 in a first embodiment.

FIG. 1 illustrates a driving system in the present embodiment. This driving system includes a semiconductor switching element 1, and an electronic circuit 100 for driving the semiconductor switching element 1.

The semiconductor switching element 1 is a semiconductor element whose state is switched between a driven state (on state) and a non-driven state (off state) (hereinafter referred to as "perform switching") by a current supplied from the electronic circuit 100. The semiconductor switching element 1 allows a current to flow therein in the driven state and allows no current to flow therein in the non-driven state. In the present embodiment, this semiconductor switching element 1 is a high voltage power MOSFET (Metal Oxide Semiconductor Field Effect Transistor, hereinafter, MOSFET is referred to as a MOS transistor). The high voltage power MOS transistor is given for an illustrative purpose, and the other type of element can be used. For example, this semiconductor switching element 1 may be an IGBT (Insulated Gate Bipolar Transistor), a thyristor, or the like, or may be an element made of a compound semiconductor such as SiC (silicon carbide) or GaN (gallium nitride). The semiconductor switching element 1 includes an element using a later developed semiconductor.

The semiconductor switching element 1 performs switching to drive a load which is connected to the semiconductor switching element 1 (not illustrated). This load is an electronic device that is driven by a current flowing therethrough, and examples of such an electronic device include a motor which is mounted on an air conditioner, a refrigerator, a train, a robot, or the like, and a PFC (Power Factor Correction) circuit for a server power supply. When the switching element 1 is in a driven state, the current is supplied to this load.

A gate terminal of the semiconductor switching element 1 is connected to the electronic circuit 100, and a source terminal of the semiconductor switching element 1 is connected to a reference potential. Here, the gate terminal of the semiconductor switching element 1 is also referred to as a control terminal. When the semiconductor switching element 1 is, for example, a bipolar transistor, this control terminal corresponds to a base terminal. The reference potential will be described later.

The electronic circuit 100 can control a current to be supplied to the semiconductor switching element 1. The electronic circuit 100 includes a control circuit 101, a detection circuit 102, level shifters 103 and 104, a storage 105, and a current supply circuit 110 including at least one p-type transistor Mpx (x is an integer of zero or more) and at least one n-type transistor Mnx.

The detection circuit 102 detects a voltage of the semiconductor switching element 1 and a differential value of the voltage, and transmits them to the control circuit 101. For example, the detection circuit 102 detects a voltage Vds between a drain terminal and the source terminal of the semiconductor switching element 1 (hereinafter, referred to as a voltage Vds) and an absolute value |dVds/dt| of a time differential value of the voltage Vds. In the present embodiment, the detection circuit 102 detects this value |dVds/dt|, and transmits it to the control circuit 101. This voltage Vds and the value |dVds/dt| can be generically referred to as a value associated with the voltage.

Hereinafter, the value |dVds/dt| is referred to as a differential value Di, for the purpose of description, where "i" is an integer of 1 or more. For example, the absolute value of the voltage Vds in the first switching time of the semiconductor switching element 1 is represented as "D1," and the absolute value of the voltage Vds in the second switching time is represented as "D2."

In the control circuit 101, this differential value Di is used to control a current to be supplied to the gate terminal of the semiconductor switching element 1 from the current supply circuit 110.

This detection circuit 102 is connected to the control circuit 101 and the drain terminal of the semiconductor switching element 1.

Furthermore, this detection circuit 102 may be configured to detect the state of the semiconductor switching element 1 in addition to the voltage. For example, the detection circuit 102 may be configured to detect: whether the semiconductor switching element 1 is in the driven state; a current between the drain terminal and the source terminal; and a differential value of the current.

The storage 105 is an electronic device which stores the information. In the present embodiment, the storage 105 stores the information for controlling a current to be supplied to the gate terminal of the semiconductor switching element 1 from the current supply circuit 110, the current being determined by the control circuit 101.

The storage 105 is a memory or the like. Examples of a memory include a RAM (Random Access Memory), a ROM (Read Only Memory), a PROM (Programmable ROM), an EPROM (Erasable PROM), an EEPROM (Electrically EPROM), a flash memory, and a register.

The control circuit 101 controls an amount of current to be supplied from the current supply circuit 110 to the gate terminal of the semiconductor switching element 1. The control circuit 101 controls the switching of the semiconductor switching element 1 through the control of the current supply circuit 110.

The control circuit 101 controls a command regarding driving of the semiconductor switching element 1, and the current supply circuit 110 based on the differential value Di. This command regarding driving of the semiconductor switching element 1 is transmitted to the control circuit 101 from a processing device such as a processor (not illustrated). The differential value Di is transmitted to the control circuit 101 from the detection circuit 102.

The control circuit 101 determines transistors (hereinafter, also referred to as "to be in a driven state") for supplying a current to the gate terminal of the semiconductor switching element 1, from among the transistors Mpx and Mnx which are included in the current supply circuit 110. The control circuit 101 controls the amount of current to be supplied from the current supply circuit 110 by outputting the voltage to each of the determined transistors to drive the determined transistors.

The control circuit 101 determines a target differential value Dt of the voltage between the drain terminal and the source terminal of the semiconductor switching element 1. This target differential value Dt is a value that can achieve both of the suppression of conductive noise and radiation noise (countermeasure against EMI (Electromagnetic Interference)) and the reduction in switching loss, in the switching of the semiconductor switching element 1. The target differential value Dt is a predetermined value on which the differential value Di targets in switching of the semiconductor switching element 1. The target differential value Dt may be stored in the storage 105.

In the switching of the semiconductor switching element 1, the control circuit 101 determines an amount of current to be supplied from the current supply circuit 110 in the next switching based on the differential value Di and the target differential value Dt. That is, the control circuit 101 determines the transistors to be in the driven state, from among the transistors Mpx and Mnx. The transistors to be in the driven state can vary depending on a time slot. The information on the determined transistors is stored in the storage 105, and is used in the next switching of the semiconductor switching element 1.

Note that, in the present embodiment, the differential value Di is input to the control circuit 101, but the control circuit 101 may calculate this differential value Di. In this case, the detection circuit 102 detects a voltage Vds, and then the control circuit 101 calculates a differential value Di based on the voltage Vds.

Each of the level shifters 103 and 104 is a device for adjusting the voltage to be transmitted from the control circuit 101 to the current supply circuit 110. The voltages adjusted by these level shifters pass through connection points Dp0 to Dp5 and connection points Dn0 to Dn5, respectively, to be transmitted to the current supply circuit 110. Two level shifters 103 and 104 are illustrated in FIG. 1, but the number of level shifters can be varied depending on the operating voltage of the control circuit 101 and buffers Bpx and Bnx.

The current supply circuit 110 supplies a current to the gate terminal of the semiconductor switching element 1. The current supply circuit 110 includes at least one p-type transistor Mpx and at least one n-type transistor Mnx. When these transistors are in the driven state, the current is supplied to the gate terminal of the semiconductor switching element 1. The amount of current to be supplied to the gate terminal of the semiconductor switching element 1 can be adjusted by varying the type (p-type or n-type) and the number of transistors to be in the driven state.

In the present embodiment, the transistor Mpx is described as a PMOS transistor, and the transistor Mnx is described as an NMOS transistor, but the transistors Mpx and Mnx may be other transistors, for example, bipolar transistors.

FIG. 1 illustrates the current supply circuit 110 including six PMOS transistors and six NMOS transistors as x=5 (partially not illustrated). FIG. 1 illustrates the PMOS transistors denoted by Mp0 to Mp5 and the NMOS transistors denoted by Mn0 to Mn5 to identify each transistor.

Furthermore, the current supply circuit 110 includes the buffers Bpx (x is an integer of zero or more) corresponding to the respective PMOS transistors Mpx and the buffers Bnx corresponding to the respective NMOS transistor Mnx. Each of these buffers adjusts and outputs the input voltage. Each of these buffers is formed by the corresponding p-type transistor and n-type transistor.

The voltages transmitted from the control circuit 101 pass through the level shifters 103 and 104, and the resulting voltages are input to the buffers through the connection points Dp0 to Dp5 and Dn0 to Dn5, respectively. When the voltage is input from each of these buffers to the corresponding transistor, the transistor is in the driven state and supplies the current to the gate terminal of the semiconductor switching element 1.

The current is supplied to the gate terminal of the semiconductor switching element 1 from the transistors that are in the driven state, and the voltage and current applied to the gate terminal become Vg and Ig, respectively.

A source terminal of each of the PMOS transistors Mpx is connected to a power supply potential VDD, and a source terminal of each of the NMOS transistors is connected to the reference potential. The power supply potential VDD is a potential of the power supply that is supplied to the electronic circuit 100 from an external power supply, but includes a device (not illustrated) in the electronic circuit 100, for example, a potential adjusted through a DC/DC converter, an LDO, or the like. The reference potential is a potential set to be lower than the power supply potential VDD, without limiting to the ground (zero V).

The drain terminals of the PMOS transistors Mpx and the drain terminals of the NMOS transistors Mnx are connected to each other, respectively, at the gate terminal of the semiconductor switching element 1. For example, the drain terminal of the PMOS transistor Mp0 and the drain terminal of the NMOS transistor Mn0 are connected to each other at the gate terminal of the semiconductor switching element 1.

The buffers Bpx and Bnx are connected to the gate terminals of the corresponding PMOS transistor Mpx and NMOS transistor Mnx, respectively. FIG. 1 illustrates the current supply circuit 110 including 12 buffers (partially not illustrated). For example, the buffer Bp0 is connected to the gate terminal of the PMOS transistor Mp0, and the buffer Bn0 is connected to the gate terminal of the NMOS transistor Mn0.

The buffers Bpx are connected to a potential VBp for buffers and the gate terminal of the semiconductor switching element 1, and the buffers Bnx are connected to a potential VBn for buffers and the reference potential.

The electronic circuit 100 described above is implemented in an integrated circuit such as an IC (Integrated Circuit) and an LSI (Large Scale Integration). The electronic circuit 100 may be implemented collectively on one chip, or a partial circuit may be implemented on another chip. Functions of the control circuit 101 and the detection circuit 102 may be implemented by the processing device such as a processor.

FIG. 1 illustrates an example of the electronic circuit 100. The number of PMOS transistors and the number of NMOS transistors can be arbitrarily set, respectively. The number of PMOS transistors and the number of NMOS transistors may be different from each other. The number of buffers can be arbitrarily set. The buffers may be provided not only in the current supply circuit 110 but also in the electronic circuit 100.

Next, the operation of the electronic circuit 100 will be described with reference to FIG. 2 to FIG. 7.

Figure 2:
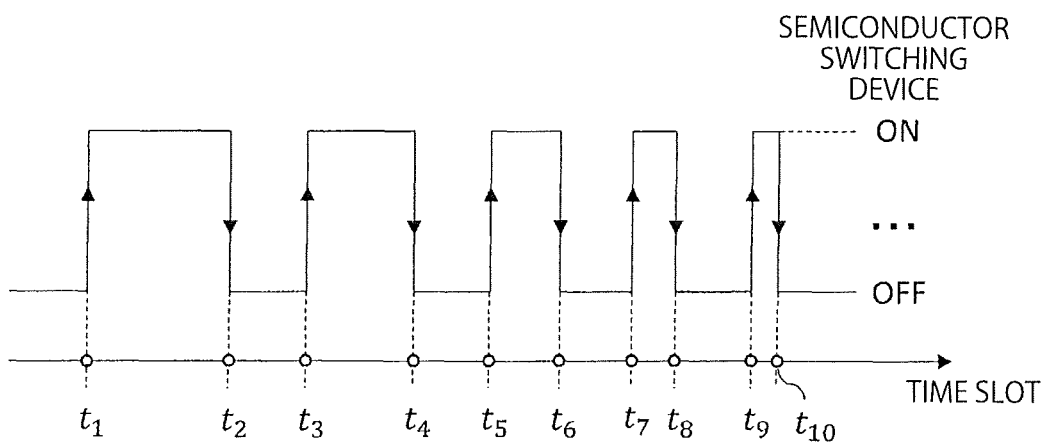
FIG. 2 is a graph illustrating switching of a semiconductor switching element 1 in time series.

The control circuit 101 receives a command for the switching of the semiconductor switching element 1 from the processing device (not illustrated). For example, FIG. 2 is a graph illustrating an example of the command for the switching. As illustrated in FIG. 2, the control circuit 101 causes the switching element 1 to be in the driven state in the time slots t1, t3, t5, t7, and t9, and causes the switching element 1 to be in the non-driven state in the time slots t2, t4, t6 t8, and t10. Each of these time slots t1 to t10 means a time slot before and after a time point when the state of the semiconductor switching element 1 is actually switched between the driven state and the non-driven state, and is represented by an open circle in FIG. 2.

This command of the switching may be sequentially sent to the control circuit 101.

The detection circuit 102 sequentially detects a differential value Di of the switching element 1, and sends it to the control circuit 101.

The control circuit 101 controls an amount of current to be supplied from the current supply circuit 110 so that the differential value D1 approaches the target differential value Dt in each of these switchings of the switching element 1. More specifically, the control circuit 101 inputs the voltage to each of the transistors to be in the driven state from among the transistors Mpx and Mnx.

The control circuit 101 determines transistors to be in the driven state in the next switching and a time slot during which the transistors are in the driven state, based on the transistors that are in the driven state and the differential value Di in the present switching of the semiconductor switching element 1, and the target differential value Dt.

For example, based on the transistors that are in driven state and a differential value D1 in the first process of switching the state of the semiconductor switching element 1 to the driven state in the time slot t1 (hereinafter, also referred to as "rise"), and the target differential value Dt, the control circuit 101 determines transistors to be in the driven state in the time slot t3 when the second rise of the semiconductor switching element 1 is performed and the time slot during which the transistors are in the driven state.

In the same manner, based on the transistors that are in the driven state and the differential value D1 in the first process of switching the state of the semiconductor switching element 1 to the non-driven state in the time slot t2 (hereinafter, also referred to as "fall"), and the target differential value Dt, the control circuit 101 determines transistors to be in the driven state in the time slot t4 when the second fall of the semiconductor switching element 1 is performed and the time slot during which the transistors are in the driven state.

That is, the control circuit 101 feeds back the transistors that are in the driven state and the differential value Di in the switching of the semiconductor switching element 1, and the target differential value Dt, and determines the conditions in the next switching. These conditions include transistors to be in the driven state from among the transistors Mpx and Mnx, and a time slot during which the transistors are in the driven state.

Hereinafter, the operation of the control circuit 101 will be specifically described with reference to FIG. 3 to FIG. 7. Before the operation of the control circuit 101 is described, driving forces of the PMOS transistors Mp0 to Mp5 and the NMOS transistors Mn0 to Mn5 in the present embodiment will be described. The driving forces represent an amount of current to be supplied to the gate terminal of the semiconductor switching element 1 in the case where the transistors are in the driven state. In the present embodiment, the PMOS transistors Mp0 to Mp5 have driving forces Wp0 to Wp5, respectively, and the NMOS transistors Mn0 to Mn5 have driving forces Wn0 to Wn5, respectively. These driving forces may be arbitrarily set depending on the transistors.

Figure 3:
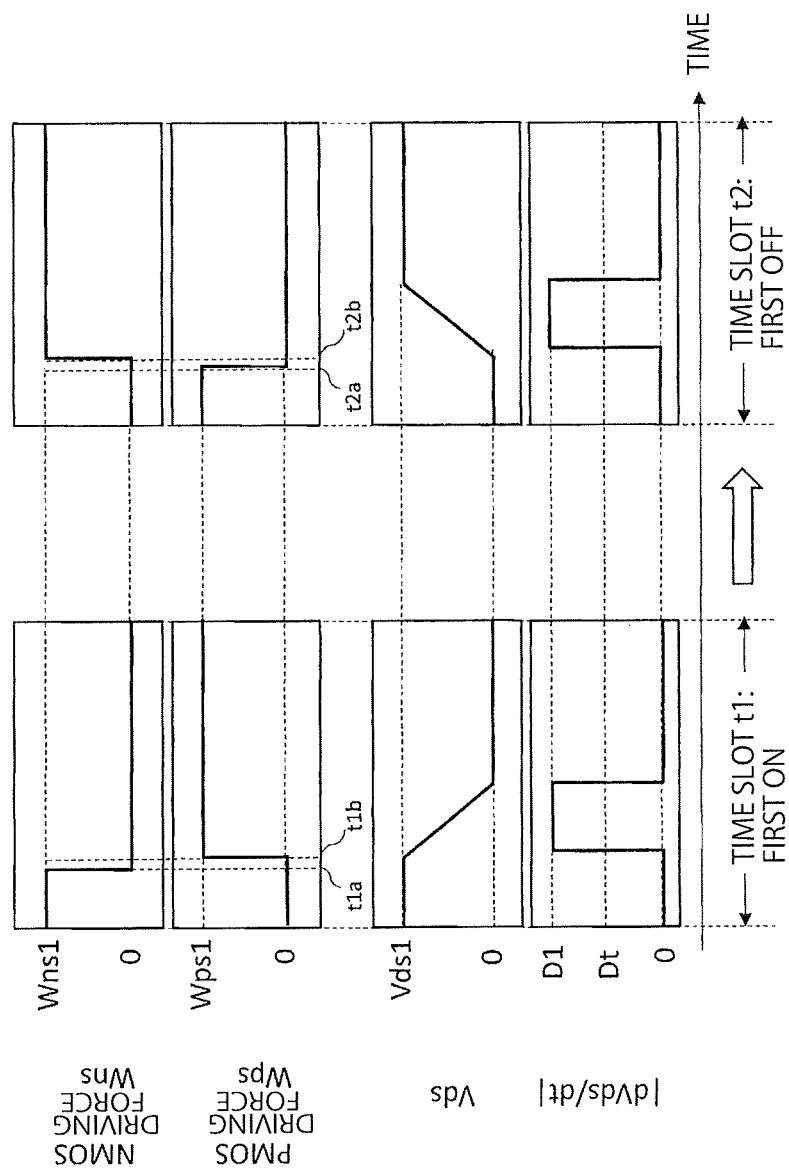
FIG. 3 is a graph illustrating the first rise and fall of the semiconductor switching element 1.

FIG. 3 is a graph illustrating parameters when the control circuit 101 performs the first rise of the semiconductor switching element 1 in the time slot t1 and performs the first fall of the semiconductor switching element 1 in the time slot t2. The driving force Wps represents the total of driving forces of the transistors that are in the driven state from among the PMOS transistors Mp0 to Mp5. The driving force Wns represents the total of driving forces of the transistors that are in the driven state from among the NMOS transistors Mn0 to Mn5. FIG. 3 illustrates the driving forces Wps and Wns, the voltage Vds, and the differential value |dVds/dt|=Di in the rise and fall of the semiconductor switching element 1. In the present embodiment, the voltage Vds is not acquired directly by the control circuit 101, but is illustrated for the description of the differential value Di.

Note that the control circuit 101 calculates the driving force Wps of the PMOS transistors and the driving force Wns of the NMOS transistors at the arbitrary time, based on the transistors that are in the driven state. The differential value Di is acquired by the detection circuit 102, and is sent to the control circuit 101.

Furthermore, at least one NMOS transistor is in the driven state before the time slot t1 when the rise of the semiconductor switching element 1 is performed. For example, all of the NMOS transistors Mn0 to Mn5 are in the driven state.

To drive the NMOS transistors, the control circuit 101 outputs the voltages to the NMOS transistors Mn0 to Mn5, respectively. These voltages are adjusted by the level shifter 103. The adjusted voltages are input to the NMOS transistors Mn0 to Mn5 through the connection points Dn0 to Dn5 and the buffers Bn0 to Bn5, respectively. Thus, the NMOS transistors Mn0 to Mn5 are in the driven state, so that the current is supplied to the gate terminal of the semiconductor switching element 1. Therefore, the semiconductor switching element 1 is maintained in the non-driven state.

Figure 4:
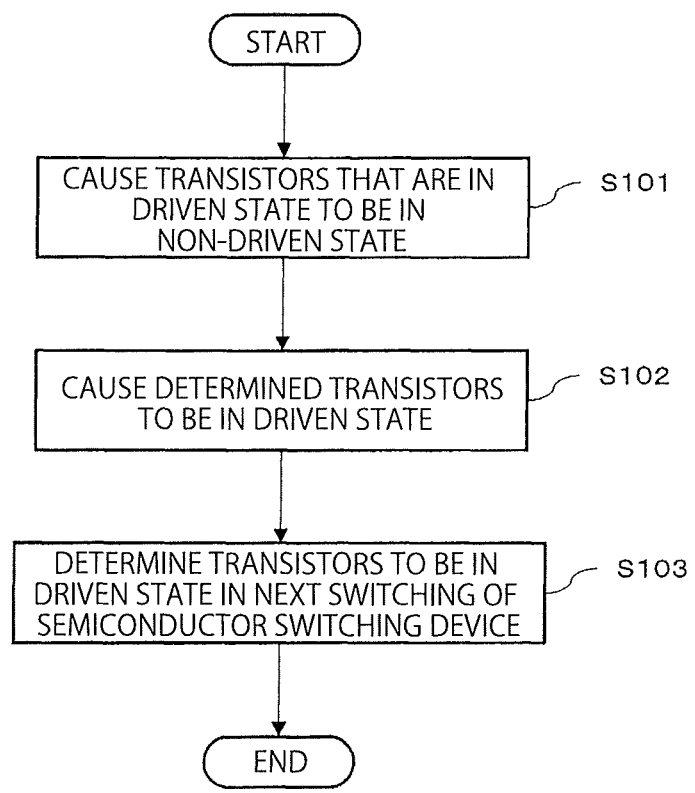
FIG. 4 is a flowchart illustrating an operation of a control circuit 101 in the switching of the semiconductor switching element 1.

The operation of the control circuit 101 in the rise of the semiconductor switching element 1 in the time slot t1 will be described with reference to FIG. 3 and FIG. 4.

First, the control circuit 101 causes the transistors that are in the driven state to be in the non-driven state (step S101). That is, the control circuit 101 stops the input of the voltages to the NMOS transistors Mn0 to Mn5 at a time t1a.

Next, the control circuit 101 causes predetermined transistors to be in the driven state (step S102). Since the first rise of the semiconductor switching element 1 is performed in the time slot t1, the transistors set initially are in the driven state.

To perform the rise of the semiconductor switching element 1, the control circuit 101 causes at least one of the PMOS transistors Mp0 to Mp5 to be in the driven state. For example, the control circuit 101 causes all of the PMOS transistors Mp0 to Mp5 to be in the driven state at a time t1b, and causes the NMOS transistors Mnx to be in the non-driven state.

More specifically, the control circuit 101 outputs the voltages to the PMOS transistors Mp0 to Mp5, respectively. These voltages are adjusted by the level shifters 103 and 104. The adjusted voltages are input to the PMOS transistors Mp0 to Mp5 through the connection points Dp0 to Dp5 and the buffers Bn0 to Bn5, respectively. Thus, the PMOS transistors Mp0 to Mp5 are in the driven state, so that the current is supplied to the gate terminal of the semiconductor switching element 1.

In FIG. 3, the driving force of the PMOS transistors that are in the driven state is represented as "Wps1." That is, the total of driving forces Wp0 to Wp5 of the respective PMOS transistors Mp0 to Mp5 is Wps1.

When the transistors of the current supply circuit 110 are in the driven state, the voltage Vds varies. Accordingly, the differential value Di is calculated as "D1" by the control circuit 101.

The control circuit 101 compares this differential value Di with the target differential value Dt to determine the transistors to be in the driven state in the next switching of the semiconductor switching element, and causes the storage 105 to store the information on the determined transistors (step S103).

In FIG. 3, "D1" is larger than the target differential value Dt. The control circuit 101 controls the driving force Wps of the PMOS transistors to be smaller than "Wps1" in a partial time slot in the second rise of the semiconductor switching element 1 in the time slot t3. More specifically, the control circuit 101 determines that the PMOS transistors Mp0 to Mp4 are to be in the driven state in this partial time slot in the second rise of the semiconductor switching element 1, and causes the storage 105 to store the information on the determined transistors. An example of the partial time slot will be described in the following description related to the second rise of the semiconductor switching element 1.

As described above, the control circuit 101 performs the rise of the semiconductor switching element 1. The control circuit 101 determines transistors to be in the driven state and the time slot during which the transistors are in the driven state in the next rise of the semiconductor switching element 1, and causes the storage 105 to store the determined information. Hereinafter, the operations of the control circuit 101 in the first fall and the second and subsequent rises and falls of the semiconductor switching element 1 are the same as the processes in step S101 through step S103.

The operation of the control circuit 101 in the fall of the semiconductor switching element 1 is also the same as that in the rise of the semiconductor switching element 1. The first fall of the semiconductor switching element 1 in the time slot t2 will be described with reference to FIG. 3.

The control circuit 101 causes the PMOS transistors that are in the driven state to be in the non-driven state at a time t2a. More specifically, the control circuit 101 stops the output of the voltages to the respective PMOS transistors Mp0 to Mp5.

Next, the control circuit 101 causes at least one of the NMOS transistors Mnx to be in the driven state. For example, suppose that the control circuit 101 causes the PMOS transistors Mp0 to Mp5 to be in the non-driven state and causes all of the NMOS transistors Mn0 to Mn5 to be in the driven state. In FIG. 3, the driving force of the NMOS transistors that are in the driven state is represented as "Wns1."

When the NMOS transistors are in the driven state, The voltage Vds is increased to "Vds1."

Next, the control circuit 101 compares this differential value Di with the target differential value Dt to determine the transistors to be in the driven state in the next switching of the semiconductor switching element, and causes the storage 105 to store the information on the determined transistors.

In FIG. 3, the differential value Di when the voltage Vds is increased to "Vds1" is represented as "D1." "D1" is larger than the target differential value Dt. The control circuit 101 controls the driving force Wns of the NMOS transistors to be smaller than Wns1 in a partial time slot in the second fall of the semiconductor switching element 1 in the time slot t4. More specifically, the control circuit 101 determines the NMOS transistors to be in the driven state, and causes the storage 105 to store the information on the determined transistors. For example, the control circuit 101 determines that the NMOS transistors Mn0 to Mn4 are to be in the driven state in this partial time slot, and causes the storage 105 to store the information on the determined transistors. An example of the partial time slot will be described in the following description related to the second fall of the semiconductor switching element 1.

As described above, the control circuit 101 performs the first fall of the semiconductor switching element 1.

Figure 5:
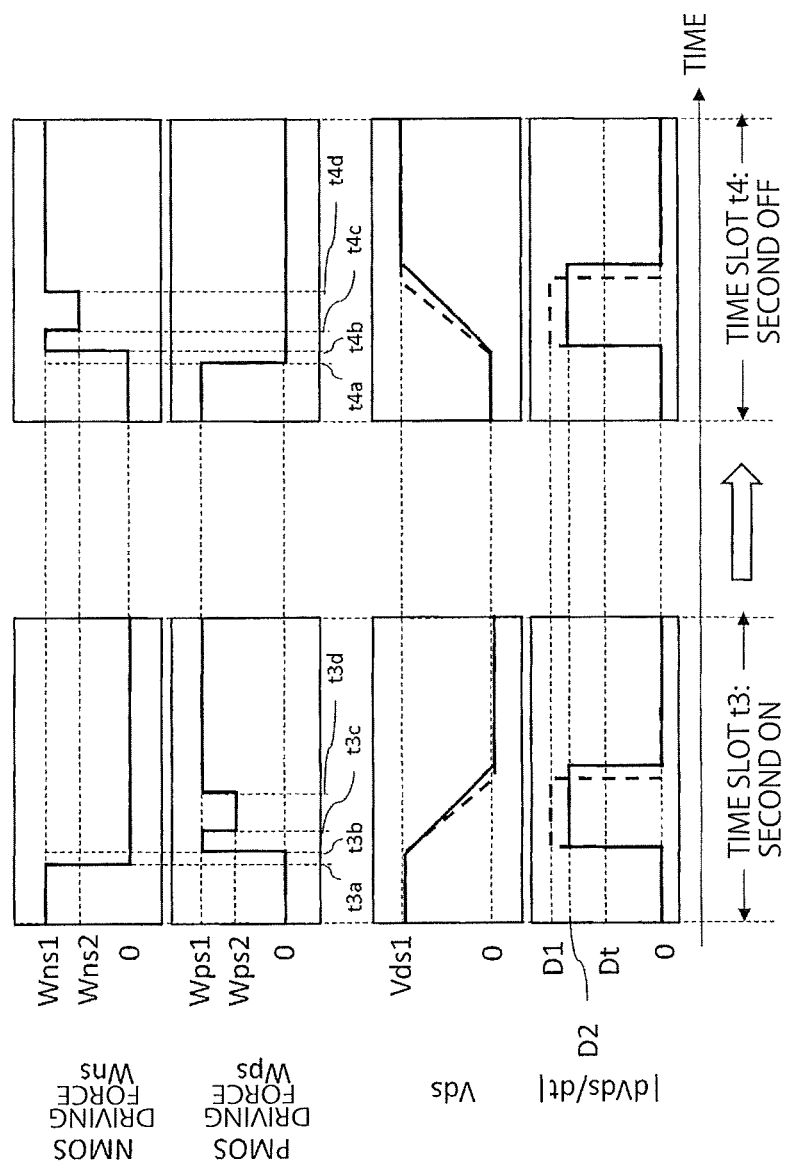
FIG. 5 is a graph illustrating the second rise and fall of the semiconductor switching element 1.

Subsequently, the control circuit 101 performs the second rise of the semiconductor switching element 1 in the time slot t3 and the second fall of the semiconductor switching element 1 in the time slot t4. FIG. 5 is a graph illustrating second rise and fall of the semiconductor switching element 1.

The control circuit 101 performs the second rise of the semiconductor switching element 1 in the time slot t3. The control circuit 101 causes the NMOS transistors that are in the driven state to be in the non-driven state at a time t3*a*, and causes the PMOS transistors to be in the driven state at a time t3*b* in the same manner as FIG. 3. The driving force Wps of the PMOS transistors at this time is "Wps1." At a time t3*c*, the control circuit 101 causes the PMOS transistors to be in the driven state based on the information stored in the storage 105 in the first rise of the semiconductor switching element 1.

That is, the control circuit 101 causes at least one of the PMOS transistors that are in the driven state to be in the non-driven state so that the driving force Wps of the PMOS transistors is smaller than "Wps1." For example, the control circuit 101 causes the PMOS transistors Mp0 to Mp4 to be in the driven state and causes the PMOS transistor Mp5 to be in the non-driven state. In FIG. 5, the driving force Wps of the PMOS transistors at this time is represented as "Wps2."

Since the driving force Wps of the PMOS transistors is reduced, the change in the voltage Vds becomes gentle. Accordingly, the differential value Di can be reduced. The control circuit 101 performs the control of causing some of the PMOS transistors to be in the non-driven state only in the partial time slot determined in the first rise of the semiconductor switching element 1. As illustrated in FIG. 5, the partial time slot is from the time t3*c* to the time t3*d*.

Then, the control circuit 101 causes the PMOS transistors to be in the driven state at the time t3*d* so that the driving force Wps of the PMOS transistors becomes "Wps1."

Next, the control circuit 101 compares this differential value Di with the target differential value Dt to determine the transistors to be in the driven state in the next switching of the semiconductor switching element, and causes the storage 105 to store the information on the determined transistors.

In the second rise, the differential value Di is "D2." In FIG. 5, the differential value D2 is still larger than the target differential value Dt. The control circuit 101 controls the driving force Wps of the PMOS transistors to be smaller than "Wps2" in a partial time slot in the third rise of the semiconductor switching element 1 in the time slot t5. More specifically, the control circuit 101 determines the PMOS transistors to be in the driven state, and causes the storage 105 to store the information on the determined transistors. For example, the control circuit 101 determines that the NMOS transistors Mn0 to Mn3 are to be in the driven state in this partial time slot, and causes the storage 105 to store the information on the determined transistors.

As described above, the control circuit 101 performs the second rise of the semiconductor switching element 1.

Next, the control circuit 101 performs the second fall of the semiconductor switching element 1 in the time slot t4. The control circuit 101 causes the PMOS transistors that are in the driven state to be in the non-driven state at a time t4*a*, and causes the NMOS transistors to be in the driven state at a time t4*b* in the same manner as FIG. 3. The driving force of the NMOS transistors at this time is "Wns1."

At a time t4*c*, the control circuit 101 causes the NMOS transistors to be in the driven state based on the information stored in the storage 105 in the first fall of the semiconductor switching element 1.

That is, the control circuit 101 causes at least one of the NMOS transistors that are in the driven state to be in the non-driven state so that the driving force Wns of the NMOS transistors is smaller than "Wns1." For example, the control circuit 101 causes the NMOS transistors Mn0 to Mn4 to be in the driven state and causes the NMOS transistor Mn5 to be in the non-driven state. In FIG. 5, the driving force Wns of the NMOS transistors at this time is represented as "Wns2."

Since the driving force Wns of the NMOS transistors is reduced, the change in the voltage Vds becomes gentle. Accordingly, the differential value Di can be reduced. The control circuit 101 performs the control of causing some of the NMOS transistors to be in the non-driven state only in the partial time slot determined in the first fall of the semiconductor switching element 1. As illustrated in FIG. 5, the partial time slot is from the time t4*c* to the time t4*d*.

Then, the control circuit 101 causes the NMOS transistors to be in the driven state at the time t4*c* so that the driving force Wns of the NMOS transistors becomes "Wns1." The voltage Vds is increased to "Vds1."

Next, the control circuit 101 compares this differential value Di with the target differential value Dt to determine the transistors to be in the driven state in the next switching of the semiconductor switching element, and causes the storage 105 to store the information on the determined transistors.

In the second fall, the differential value Di is "D2." In FIG. 5, the differential value D2 is still larger than the target differential value Dt. The control circuit 101 controls the driving force Wns of the NMOS transistors to be smaller than "Wns2" in a partial time slot in the third fall of the semiconductor switching element 1 in the time slot t6. More specifically, the control circuit 101 determines the NMOS transistors to be in the driven state, and causes the storage 105 to store the information on the determined transistors. For example, the control circuit 101 determines that the NMOS transistors Mn0 to Mn3 are to be in the driven state in this partial time slot, and causes the storage 105 to store the information on the determined transistors.

As described above, the control circuit 101 performs the second fall of the semiconductor switching element 1.

As described above, the control circuit 101 compares the differential value Di with the target differential value Dt for each rise and each fall of the semiconductor switching element 1. When this differential value Di is larger than the target differential value Dt, the control circuit 101 increases the number of transistors to be in the non-driven state in the partial time slot. That is, the control circuit 101 performs the switching of the semiconductor switching element 1 while performing feedback control. Note that the control circuit 101 decreases the number of PMOS transistors to be in the driven state in the rise of the semiconductor switching element 1, and decreases the number of NMOS transistors to be in the driven state in the fall of the semiconductor switching element 1.

Suppose that the control circuit 101 determines that the driving force Wps of the PMOS transistors is zero in the partial time slot in each of the third rise of the semiconductor switching element 1 in the time slot t5 and the fourth rise of the semiconductor switching element 1 in the time slot t7. That is, suppose that the control circuit 101 determines that all of the PMOS transistors Mpx are in the non-driven state in this partial time slot. The fourth rise of the semiconductor switching element 1 in the time slot t7 in this case will be described with reference to FIG. 6.

The control circuit 101 causes the NMOS transistors that are in the driven state to be in the non-driven state at a time t7a, and causes the PMOS transistors to be in the driven state at a time t7b in the same manner as FIG. 3 and FIG. 5. The driving force Wps of the PMOS transistors at this time is "Wps1." At a time t7c, the control circuit 101 causes the PMOS transistors that are in the driven state to be in the non-driven state based on the information stored in the storage 105 in the third rise of the semiconductor switching element 1.

Figure 6:
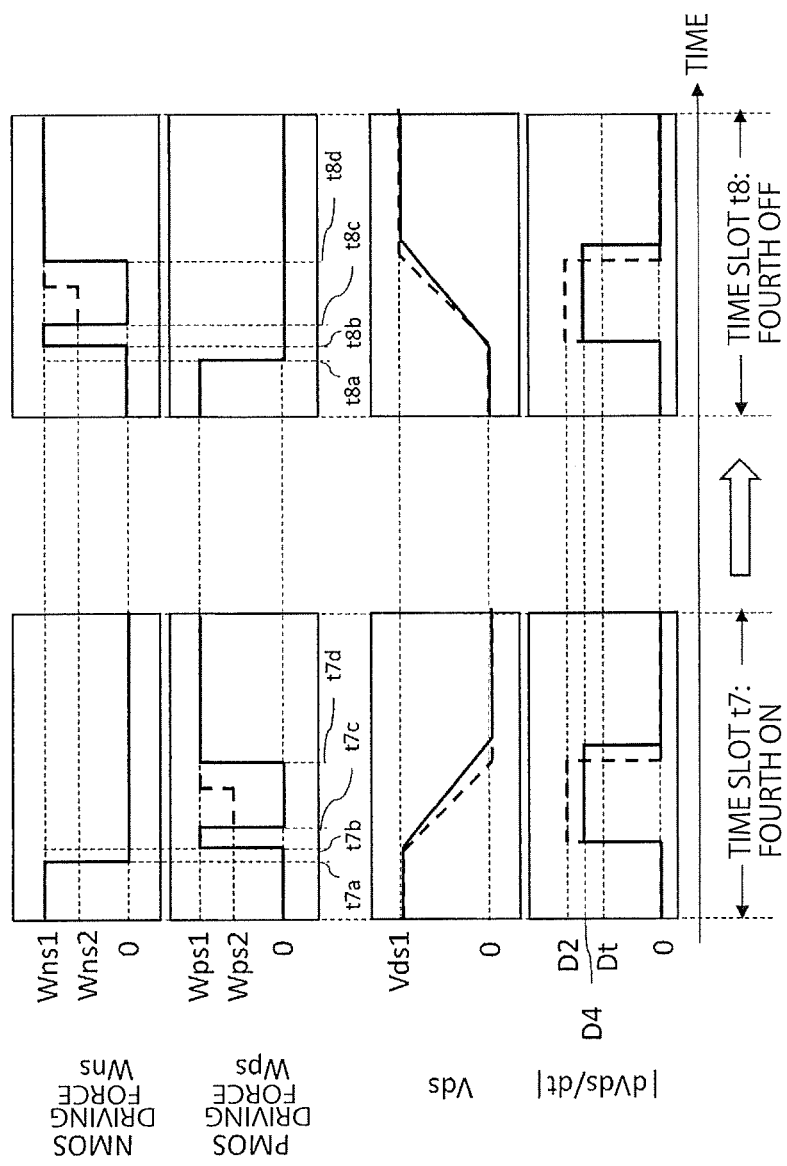
FIG. 6 is a graph illustrating the fourth rise and fall of the semiconductor switching element 1.

Since the driving force of the PMOS transistors becomes zero, the change in the voltage Vds becomes more gentle. In FIG. 6, the voltage Vds in the second rise is indicated by a broken line, and the voltage Vds in the fourth rise is indicated by a solid line. Accordingly, the differential value Di can be further reduced. Furthermore, in FIG. 6, the differential value D2 in the second rise is indicated by a broken line, and the differential value D4 in the fourth rise is indicated by a solid line.

The control circuit 101 performs the control of causing the PMOS transistors to be in the non-driven state only in the partial time slot determined in the third rise of the semiconductor switching element 1. As illustrated in FIG. 6, this partial time slot is from the time t7c to a time t7d. In FIG. 6, the driving force Wps of the PMOS transistors in the second rise is indicated by a broken line, and the driving force Wps of the PMOS transistors in the fourth rise is indicated by a solid line.

The reason why the time from the time t7c to the time t7d is longer than the time from the time t3c to the time t3d in FIG. 5 is that a slope of the voltage Vds becomes more gentle. The fact that the slope of the voltage Vds becomes gentle means that the length of time in which the differential value Di is generated is increased. Accordingly, the control circuit 101 determines that the partial time slot in which the driving force Wps of the PMOS transistors varies is increased.

Then, the control circuit 101 causes the PMOS transistors to be in the driven state at the time t7d so that the driving force Wps of the PMOS transistors becomes "Wps1."

Next, the control circuit 101 compares this differential value Di with the target differential value Dt to determine the transistors to be in the driven state in the next switching of the semiconductor switching element, and causes the storage 105 to store the information on the determined transistors.

In the fourth rise, the differential value Di is "D4." In FIG. 6, the differential value D4 is still larger than the target differential value Dt. The control circuit 101 determines that the PMOS transistors are to be in the non-driven state in a partial time slot in the fifth rise of the semiconductor switching element 1 in the time slot t9, and at least one of the NMOS transistors is to be in the driven state in this partial time slot, and causes the storage 105 to the information on the determined transistors. For example, the control circuit 101 determines that the NMOS transistor Mn0 is to be in the driven state, and causes the storage 105 to store the information on the NMOS transistor Mn0.

As described above, the control circuit 101 performs the fourth rise of the semiconductor switching element 1.

On the other hand, the fourth fall of the semiconductor switching element 1 in the time slot t8 is also performed based on the same assumption as the fourth rise. That is, this means that the control circuit 101 has determined, in the third fall of the semiconductor switching element 1 in the time slot t6, that the driving force of the NMOS transistors is to be zero in a partial time slot in the fourth fall. That is, the control circuit 101 has determined that all of the NMOS transistors Mnx are to be in the non-driven state in this partial time slot. The fourth rise of the semiconductor switching element 1 in this case will be described with reference to FIG. 6.

The control circuit 101 causes the PMOS transistors that are in the driven state to be in the non-driven state at a time t8a, and causes the NMOS transistors to be in the driven state at a time t8b in the same manner as FIG. 3 and FIG. 5. The driving force Wns of the NMOS transistors at this time is "Wns1." At a time t8c, the control circuit 101 causes the NMOS transistors that are in the driven state to be in the non-driven state based on the information stored in the storage 105 in the third fall of the semiconductor switching element 1.

Since the driving force of the NMOS transistors becomes zero, the change in the voltage Vds becomes more gentle. In FIG. 6, the voltage Vds in the second fall is indicated by a broken line, and the voltage Vds in the fourth fall is indicated by a solid line. Accordingly, the differential value Di can be further reduced. Furthermore, in FIG. 6, the differential value D2 in the second fall is indicated by a broken line, and the differential value D4 in the fourth fall is indicated by a solid line.

The control circuit 101 performs the control of causing the NMOS transistors to be in the non-driven state only in the partial time slot determined in the third fall of the semiconductor switching element 1. As illustrated in FIG. 6, this partial time slot is from the time t8c to a time t8d. In FIG. 6, the driving force Wps of the PMOS transistors in the second rise is indicated by a broken line, and the driving force Wps of the PMOS transistors in the fourth rise is indicated by a solid line.

The reason why the time from the time t8c to the time t8d is longer than the time from the time t4c to the time t4d in FIG. 5 is the same as the reason described in the fourth rise.

Then, the control circuit 101 causes the NMOS transistors to be in the driven state at the time t8d so that the driving force Wns of the NMOS transistors becomes "Wns1."

Next, the control circuit 101 compares this differential value Di with the target differential value Dt to determine the transistors to be in the driven state in the next switching of the semiconductor switching element, and causes the storage 105 to store the information on the determined transistors.

In the fourth fall, the differential value Di is "D4." In FIG. 6, the differential value D4 is still larger than the target differential value Dt. The control circuit 101 determines that the NMOS transistors are to be in the non-driven state in a partial time slot in the fifth fall of the semiconductor switching element 1 in the time slot t10, and at least one of the PMOS transistors is to be in the driven state in this partial time slot, and causes the storage 105 to the information on the determined transistors. For example, the control circuit 101 determines that the PMOS transistor Mp0 is to be in the driven state, and causes the storage 105 to store the information on the PMOS transistor Mp0.

As described above, the control circuit 101 performs the fourth fall of the semiconductor switching element 1.

As described above, the control circuit 101 causes the PMOS transistors to be in the non-driven state in the rise of the semiconductor switching element 1 in the partial time slot and causes the NMOS transistors to be in the non-driven state in the fall of the semiconductor switching element 1 in the partial time slot. However, when the differential value Di does not reach the target differential value Dt, the control circuit 101 determines that at least one of the other type of transistors is to be in the driven state in the next rise and the next fall. That is, the control circuit 101 determines that at least one of the NMOS transistors is to be in the driven state in the partial time slot in the rise of the semiconductor switching element 1 and at least one of the PMOS transistors is to be in the driven state in the partial time slot in the fall of the semiconductor switching element 1. The fifth rise and fall of the semiconductor switching element 1 will be described with reference to FIG. 7.

First, the fifth rise of the semiconductor switching element 1 in the time slot t9 will be described. The control circuit 101 causes the NMOS transistors that are in the driven state to be in the non-driven state at a time t9a, and causes the PMOS transistors to be in the driven state at a time t9b in the same manner as FIG. 3 to FIG. 6. The driving force Wps of the PMOS transistors at this time is "Wps1."

At a time t9c, the control circuit 101 causes the PMOS transistors that are in the driven state to be in the non-driven state based on the information stored in the storage 105 in the fourth rise of the semiconductor switching element 1. Furthermore, at a time t9d, the control circuit 101 causes at least one of the NMOS transistors to be in the driven state based on the information stored in the storage 105 in the same manner. For example, the control circuit 101 causes the NMOS transistor Mn0 to be in the driven state. The driving force Wns of the NMOS transistors at this time is "Wns3."

Figure 7:
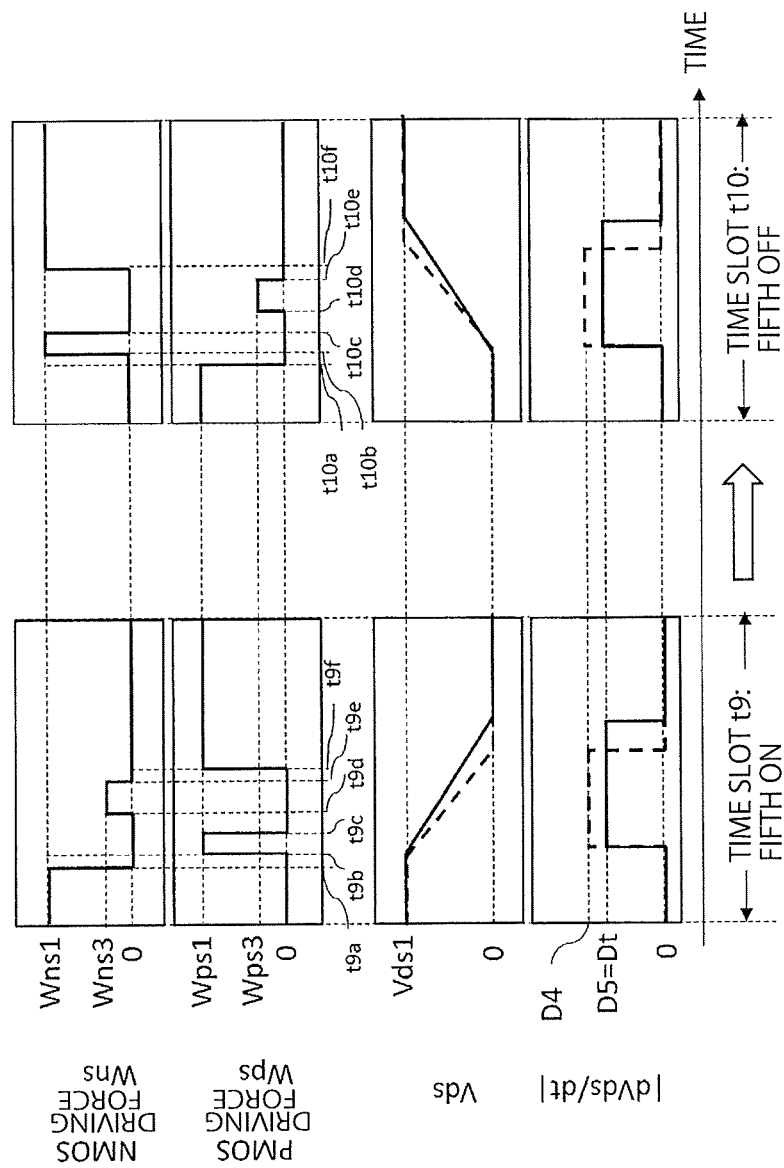
FIG. 7 is a graph illustrating the fifth rise and fall of the semiconductor switching element 1.

Since the driving force of the PMOS transistors becomes zero and the NMOS transistor is in the driven state, the change in the voltage Vds becomes more gentle. In FIG. 7, the voltage Vds in the fourth rise is indicated by a broken line, and the voltage Vds in the fifth rise is indicated by a solid line. Accordingly, the differential value Di can be further reduced. Furthermore, in FIG. 7, the differential value D4 in the fourth rise is indicated by a broken line, and the differential value D5 in the fifth rise is indicated by a solid line.

Only in the partial time slot determined in the fourth rise of the semiconductor switching element 1, the control circuit 101 performs the control of causing the PMOS transistors to be in the non-driven state and the control of causing at least some of the NMOS transistors to be in the driven state. As illustrated in FIG. 7, the control circuit 101 causes the PMOS transistors to be in the non-driven state in a time slot from the time t9c to the time t9f and causes at least one of the NMOS transistors to be in the driven state in a time slot from the time t9d to the time t9e.

Then, the control circuit 101 causes the NMOS transistors to be in the non-driven state at the time t9e, and causes the PMOS transistors to be in the driven state at the time t9f so that the driving force Wps of the PMOS transistors becomes "Wps1."

Next, the control circuit 101 compares this differential value Di with the target differential value Dt to determine the transistors to be in the driven state in the next switching of the semiconductor switching element, and causes the storage 105 to store the information on the determined transistors.

In the fifth rise, the differential value Di is "D5." As illustrated in FIG. 7, the relationship between the differential value and the target differential value is represented as D5=Dt. The control circuit 101 causes the storage 105 to store information that the fifth control performed here is performed in the next and subsequent rises of the semiconductor switching element 1. The control circuit 101 causes the storage 105 to also store the type of the semiconductor switching element 1, so that this control can be applied to a semiconductor switching element the same as this semiconductor switching element 1.

The control circuit 101 may set a threshold in the vicinity of the target differential value Dt. When the differential value Di is within this threshold, the control circuit 101 determines that the differential value Di has reached the target differential value Dt, and may cause the storage 105 to store information that the same control as the control performed here is also performed in the subsequent controls.

As described above, the control circuit 101 performs the fifth rise of the semiconductor switching element 1.

On the other hand, the fifth fall of the semiconductor switching element 1 at the time slot t10 will be described. The control circuit 101 causes the PMOS transistors that are in the driven state to be in the non-driven state at a time t10a, and causes the NMOS transistors to be in the driven state at a time t10b in the same manner as FIG. 3 to FIG. 6. The driving force Wns of the NMOS transistors at this time is "Wns1."

At a time t10c, the control circuit 101 causes the NMOS transistors that are in the driven state to be in the non-driven state based on the information stored in the storage 105 in the fourth fall of the semiconductor switching element 1. Furthermore, at a time t10d, the control circuit 101 causes at least one of the PMOS transistors to be in the driven state based on the information stored in the storage 105 in the same manner. For example, the control circuit 101 causes the PMOS transistor Mp0 to be in the driven state. The driving force Wps of the PMOS transistors at this time is "Wps3."

Since the driving force of the NMOS transistors becomes zero and the PMOS transistor is in the driven state, the change in the voltage Vds becomes more gentle. In FIG. 7, the voltage Vds in the fourth fall is indicated by a broken line, and the voltage Vds in the fifth fall is indicated by a solid line. Accordingly, the differential value Di can be further reduced. In FIG. 7, the differential value D4 in the fourth fall is indicated by a broken line, and the differential value D5 in the fifth rise is indicated by a solid line.

The control circuit 101 performs the control of causing the NMOS transistors to be in the non-driven state and the control of causing at least some of the PMOS transistors to be in the driven state only in the partial time slot determined in the fourth fall of the semiconductor switching element 1. As illustrated in FIG. 7, the control circuit 101 causes the NMOS transistors to be in the non-driven state in a time slot from the time t10c to the time t10f and causes at least one of the PMOS transistors to be in the driven state in a time slot from the time t10d to the time t10e.

Then, the control circuit 101 causes the PMOS transistors to be in the non-driven state at the time t10e, and causes the NMOS transistors to be in the driven state at the time t10f so that the driving force Wns of the NMOS transistors becomes "Wns1."

In the fifth fall, the differential value Di is "D5." As illustrated in FIG. 7, the relationship between the differential value and the target differential value is represented as D5=Dt. The control circuit 101 causes the storage 105 to store information that the fifth control performed here is performed in the next and subsequent falls of the semiconductor switching element 1. The control circuit 101 causes the storage 105 to also store the type of the semiconductor switching element 1, so that this control can be applied to a semiconductor switching element the same as this semiconductor switching element 1.

The control circuit 101 may set a threshold in the vicinity of the target differential value Dt. When the differential value Di is within this threshold, the control circuit 101 determines that the differential value Di has reached the target differential value Dt, and may cause the storage 105 to store information that the same control as the control performed here is also performed in the subsequent controls.

As described above, the control circuit 101 performs the fifth fall of the semiconductor switching element 1.

As described above, the control circuit 101 not only causes, in the partial time slot, the PMOS transistors to be in the non-driven state in the rise and the NMOS transistors to be in the non-driven state in the fall but also causes at least one of the other type of transistors to be in the driven state, whereby the differential value Di can be taken in a wider range. The fact that the differential value Di can be taken in the wider range enables the switching to be performed while both suppressing conductive noise and radiation noise and reducing a switching loss.

In the above, the case where the differential value Di is larger than the target differential value Dt has been described. The case where the differential value Di is smaller than the target differential value Dt will be described with reference to FIG. 8 and FIG. 9. Note that as a premise of this description, the control circuit 101 causes the PMOS transistors to be in the non-driven state and the other type of transistors to be in the driven state in the partial time slot in the rise, and causes the NMOS transistors to be in the non-driven state and the other type of transistors to be in the driven state in the partial time slot in the fall (in the same manner as with the case illustrated in FIG. 7).

Figure 8:
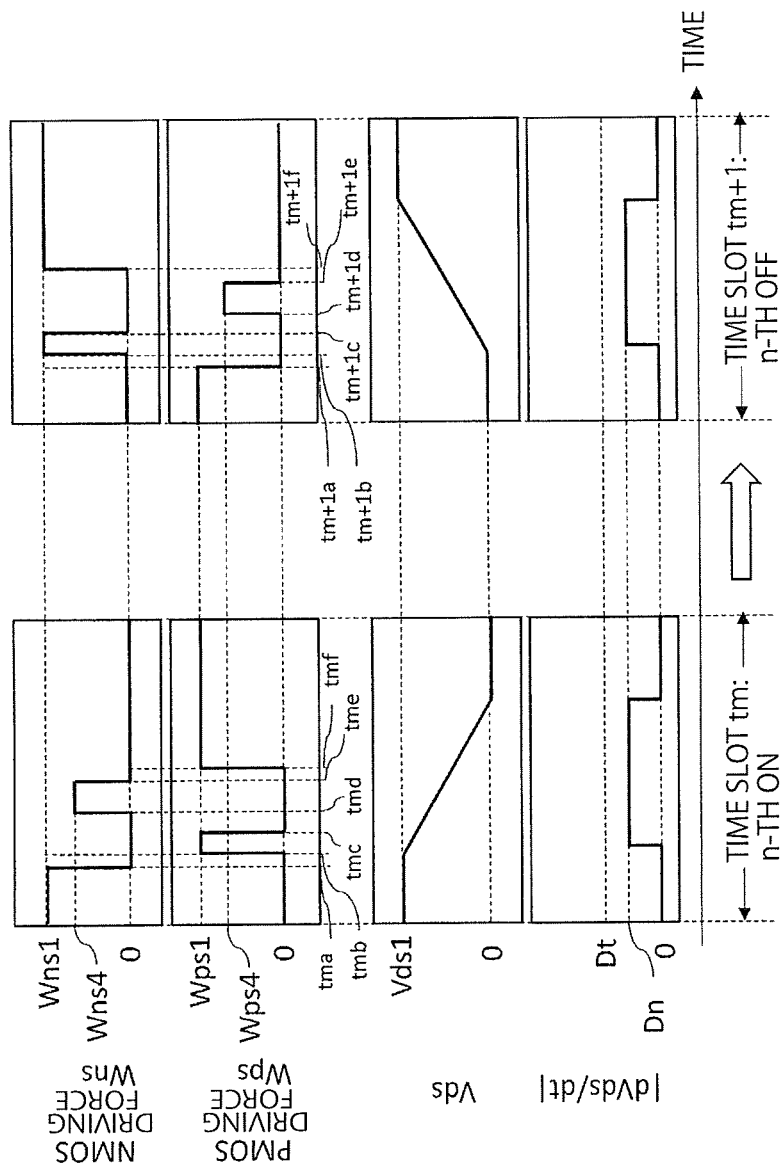
FIG. 8 is a graph illustrating the rise and fall of the semiconductor switching element 1 when a differential value Di falls below a target differential value Dt.

FIG. 8 illustrates the n-th rise and fall of the semiconductor switching element 1. First, the rise of the semiconductor switching element 1 will be described. The control circuit 101 causes the NMOS transistors to be in the non-driven state at a time tma, and causes the PMOS transistors to be in the driven state at a time tmb so that the driving force Wps of the PMOS transistors becomes "Wps1."

The control circuit 101 controls the transistors from a time tmc based on the information on the transistors stored in the storage 105. That is, the control circuit 101 causes the PMOS transistors to be in the non-driven state in a time slot from a time tmc to a time tmf and causes at least one of the NMOS transistors to be in the driven state in a time slot from a time tmd to a time tme so that the driving force of the NMOS transistors becomes "Wns4." Here, "Wns4" is larger than "Wns3." The control circuit 101 causes the NMOS transistors to be in the non-driven state again at the time tme, and causes the PMOS transistors to be in the driven state at the time tmf so that the driving force Wps of the PMOS transistors becomes "Wps1."

Since "Wns4" is larger than "Wns3," the differential value Dn is smaller than the target differential value Dt. In the (n+1)-th rise of the semiconductor switching element 1, the control circuit 101 determines transistors to be in the driven state so that the driving force Wns of the NMOS transistors to be in the driven state in a partial time slot is smaller than "Wns4," and causes the storage 105 to store the information on the determined transistors.

As described above, the control circuit 101 performs the n-th rise of the semiconductor switching element 1.

On the other hand, the fall of the semiconductor switching element 1 in this case will be described. The control circuit 101 causes the PMOS transistors to be in the non-driven state at a time tm+1a, and causes the NMOS transistors to be in the driven state at a time tm+1b so that the driving force Wns of the NMOS transistors becomes "Wns1."

The control circuit 101 controls the transistors from a time tm+1c based on the information on the transistors stored in the storage 105. That is, the control circuit 101 causes the NMOS transistors to be in the non-driven state in a time slot from a time tm+1c to a time tm+1f and causes at least one of the PMOS transistors to be in the driven state in a time slot from a time tm+1d to a time tm+1e so that the driving force of the PMOS transistors becomes "Wps4." Here, "Wps4" is larger than "Wps3." The control circuit 101 causes the PMOS transistors to be in the non-driven state again at the time tm+1e, and causes the NMOS transistors to be in the driven state so that the driving force Wns of the NMOS transistors becomes "Wns1."

Since "Wps4" is larger than "Wps3," the differential value Dn is smaller than the target differential value Dt. In the (n+1)-th fall of the semiconductor switching element 1, the control circuit 101 determines transistors to be in the driven state so that the driving force Wps of the PMOS transistors to be in the driven state in a partial time slot is smaller than "Wps4," and causes the storage 105 to store the information on the determined transistors.

As described above, the control circuit 101 performs the n-th fall of the semiconductor switching element 1.

As described above, when the differential value Di is smaller than the target differential value Dt, the control circuit 101 determines transistors to be in the driven state so that the driving force of the transistors to be in the small state in a partial time slot. That is, the control circuit 101 causes the NMOS transistors to be in the driven state in the rise of the semiconductor switching element 1 and causes the PMOS transistors to be in the driven state in the fall of the semiconductor switching element 1, so that the driving force is smaller than the driving force in this control.

The present embodiment has been described above, but figures are just illustrative examples, and representations may be different. For example, the electronic circuit 100 illustrated in FIG. 1 does not include the semiconductor switching element 1, but the electronic circuit 100 may be configured to include the semiconductor switching element 1.

The voltage Vds and the differential value Di illustrated in FIG. 3 through FIG. 8 are represented by straight lines, but may be represented by curves.

From the driving forces of the PMOS transistors and the NMOS transistors illustrated in FIG. 3 through FIG. 8, the PMOS transistors and the NMOS transistors appear to be switched between the driven state and the non-driven state at the same time, but are not necessarily switched between the driven state and the non-driven state at the same time unless it affects the switching of the semiconductor switching element 1.

In the rise of the semiconductor switching element 1 in FIG. 7, the control circuit 101 causes the NMOS transistors to be in the driven state in a time slot from the time t9d to the time t9e, but the time slot in which the NMOS transistors are in the driven state is not limited to this time slot. The time slot in which the NMOS transistors are in the driven state can be arbitrarily set in the time slot from the time t9c to the time t9f in which the PMOS transistors are temporarily in the non-driven state. In the same manner in the fall of the semiconductor switching element 1, the time slot in which the PMOS transistors are in the driven state can be arbitrarily set in the time slot from the time t10c to the time t10f in which the NMOS transistors are temporarily in the non-driven state. Note that the same applies to FIG. 8.

Furthermore, a modified example of the present embodiment can be variously implemented and practiced. For example, in the present embodiment, in the rise and fall of the semiconductor switching element 1, the target differential values Dt represented in FIG. 3 through FIG. 8 are the same, but the target differential values may be different among FIG. 3 through FIG. 8.

In the present embodiment, the detection circuit 102 acquires the differential value Di and conveys it to the control circuit 101, but the detection circuit 102 may acquire the voltage Vds and convey it to the control circuit 101 so that the control circuit 101 calculates the differential value Di.

In the present embodiment, the results of the rise and fall of the semiconductor switching element 1 are fed back so that the differential value Di approximates the target differential value Dt. The storage 105 may store in advance the value contributing to the differential value Di depending on whether each of the individual transistors is in the driven state or in the non-driven state. The control circuit 101 may determine the transistors to be in the driven state based on the difference between the differential value Di and the target differential value Dt, and this value contributing to the differential value Di that is stored in the storage 105. Thus, the differential value Di can approximate the target differential value Dt with a lower number of rises and falls of the semiconductor switching element 1.

Figure 9:
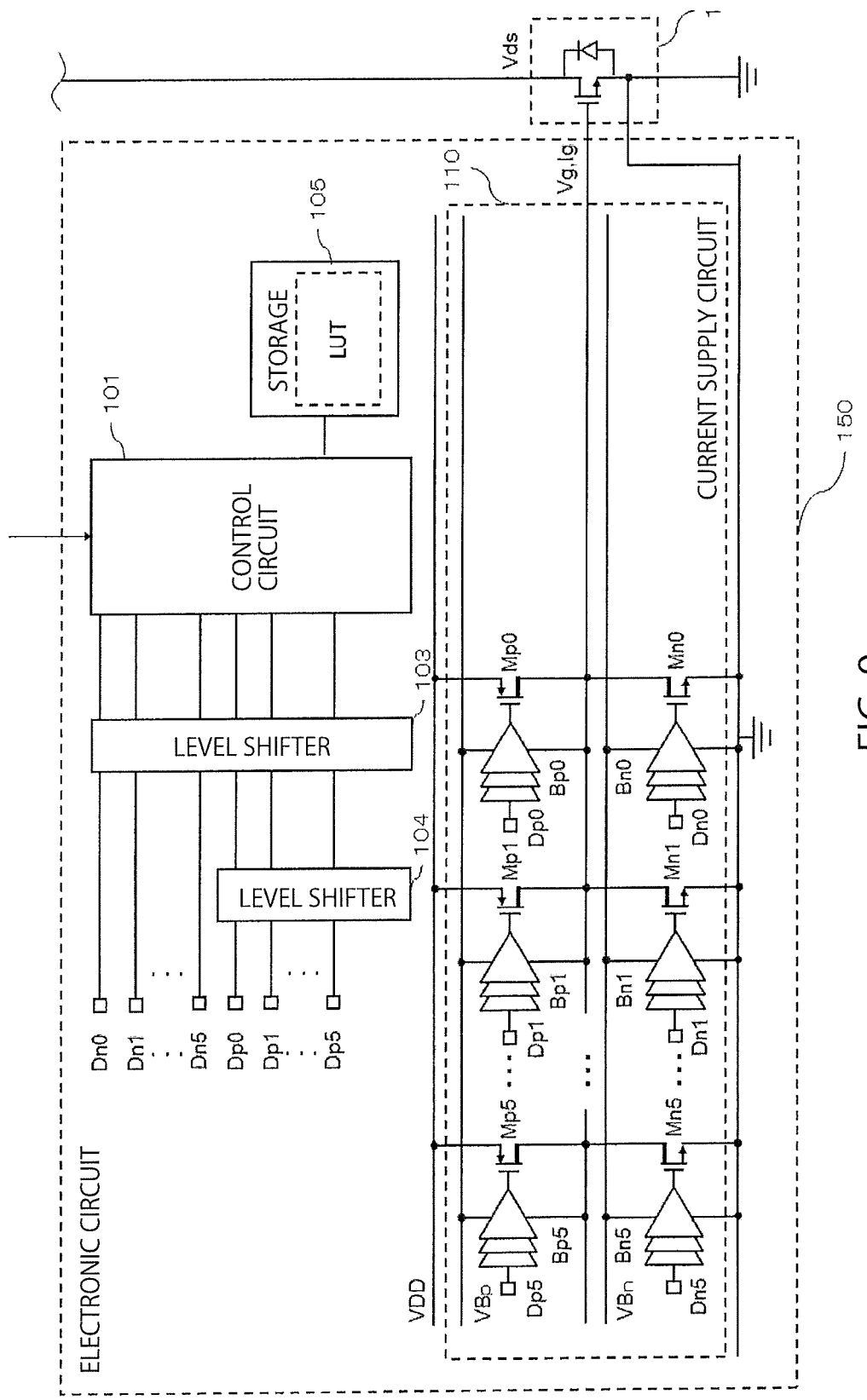
FIG. 9 is a driving system diagram including a configuration of an electronic circuit 150 applicable to the first embodiment.

In the present embodiment, the control circuit 101 controls the transistors so that the differential value Di notified by the detection circuit 102 approximates the target differential value Dt, but a configuration in which this detection circuit is not provided may be adopted. Such a configuration of an electronic circuit 150 is illustrated in FIG. 9. The same components as those of the electronic circuit 100 are denoted with the same reference numerals, and the description thereof is omitted.

The storage 105 stores driving information defining the transistors to be in the driven state while both suppressing conductive noise and radiation noise and reducing a switching loss in the rise and fall of the semiconductor switching element 1, in the form of a look-up table (LUT), for example. As illustrated in FIG. 9, the storage 105 stores the look-up table (LUT). This driving information may be acquired in advance by the electronic circuit 100 described in the present embodiment, or may be acquired from simulation or experiment.

The control circuit 101 may cause the transistors to be in the driven state based on this driving information read from the storage 105, to perform the rise and fall of the semiconductor switching element 1.

Figure 10:
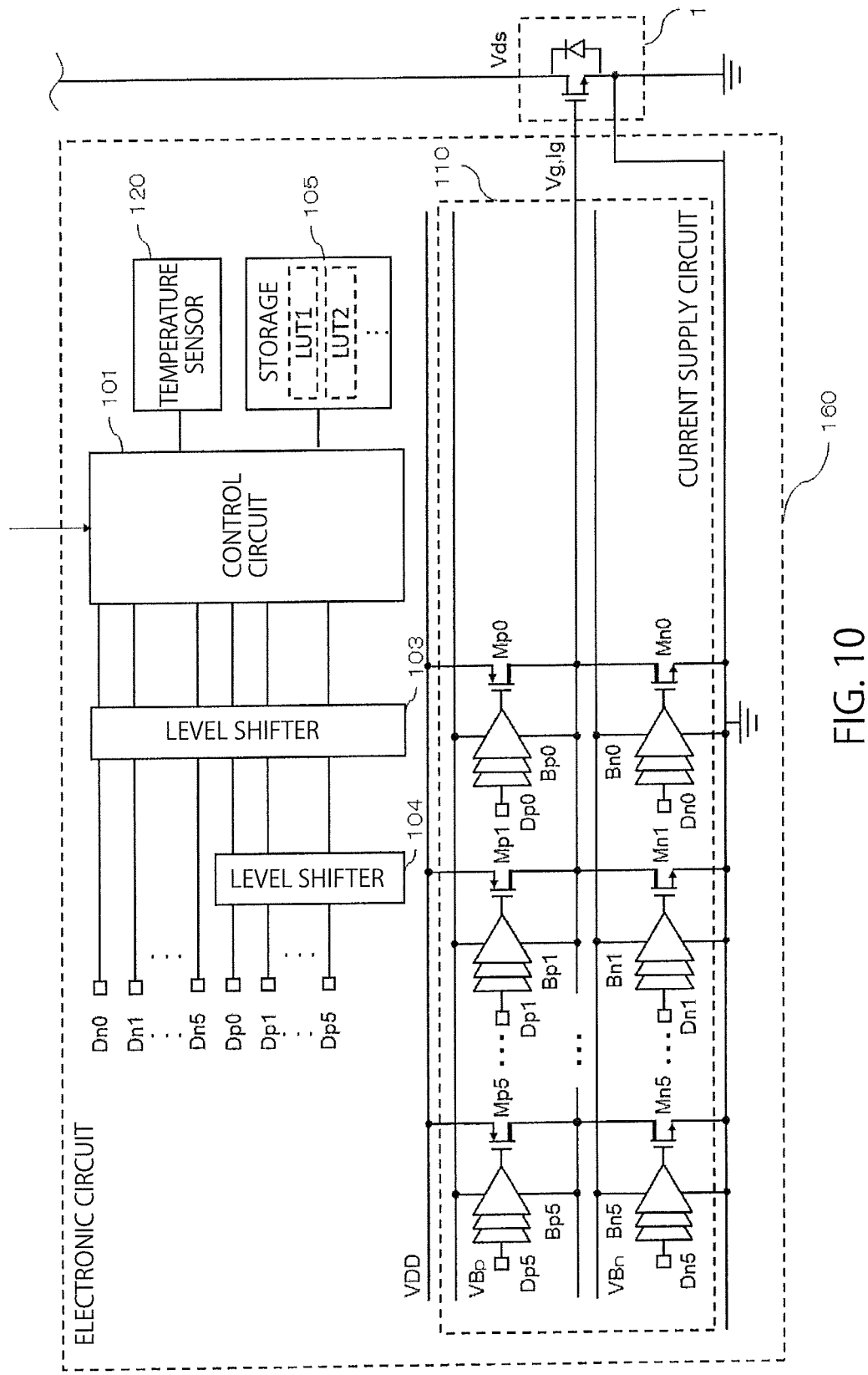
FIG. 10 is a driving system diagram including a configuration of an electronic circuit 160 applicable to the first embodiment.

This driving information may define the transistors to be in the driven state by the temperature of the semiconductor switching element 1. For example, the storage 105 may store a plurality of look-up tables defining the transistors to be in the driven state by the temperature of the semiconductor switching element 1. As illustrated in FIG. 10, the storage 105 stores the plurality of look-up tables (LUT1, LUT2, . . . ). This driving information may be acquired in advance by a circuit in which a temperature sensor is attached to the electronic circuit 100 described in the present embodiment.

Such a configuration of an electronic circuit 160 is illustrated in FIG. 10. The same components as those of the electronic circuit 100 are denoted with the same reference numerals, and the description thereof is omitted.

The electronic circuit 160 further includes a temperature sensor 120. This temperature sensor 120 measures a temperature of the semiconductor switching element 1 and conveys the temperature information to the control circuit 101. The control circuit 101 selects the look-up table suitable for the temperature of the semiconductor switching element 1 from the plurality of look-up tables stored in the storage 105, based on the temperature information, and controls the transistors.

Note that in FIG. 10, the temperature sensor 120 is provided in the electronic circuit 160, but the temperature sensor 120 can be arranged in any location where the temperature sensor 120 can convey the temperature information of the semiconductor switching element 1 to the control circuit 101. For example, the temperature sensor 120 may be provided in the semiconductor switching element 1 or may be provided independently.

In the present embodiment, the voltage Vds is measured by the detection circuit 102, and the differential value Di is calculated and the transistors are controlled by the control circuit 101, but some or all of functions of the control circuit 101 and the detection circuit 102 may be implemented by processing a program in a processor.

This processor is an electronic circuit including a controller and a calculator of the hardware. Examples of the processor may include a general purpose processor, a central processing unit (CPU), a microprocessor, a digital signal processor (DSP), a controller, a microcontroller, a state machine, an application specific integrated circuit, a field programmable gate array (FPGA), a programmable logic device (PLD), and a combination thereof.

This program can be provided by being recorded in a computer readable recording medium such as a CD-ROM, a memory card, a CD-R, and a DVD (Digital Versatile Disk) as a file in an installable format or an executable format. This program may be stored in a computer that is connected through a network such as the internet, and may be provided through a network or provided by being embodied on a recording medium such as a ROM, a HDD, and an SSD.

As described above, the electronic circuit 100 of the present embodiment controls differential value transistors with reference to the differential value Di, in the rise and fall of the semiconductor switching element 1.

In the rise of the semiconductor switching element 1, the control circuit 101 controls to temporarily reduce the number of PMOS transistors that are in the driven state so that the differential value Di reaches the target differential value Dt. In the case where the differential value Di does not reach the target differential value Dt even when the number of PMOS transistors that are in the driven state is zero, the control circuit 101 controls to further increase the number of NMOS transistors that are in the driven state so that the differential value Di reaches the target differential value Dt.

On the other hand, in the fall of the semiconductor switching element 1, the control circuit 101 controls to temporarily reduce the number of NMOS transistors that are in the driven state so that the differential value Di reaches the target differential value Dt. In the case where the differential value Di does not reach the target differential value Dt even when the number of NMOS transistors that are in the driven state is zero, the control circuit 101 controls to further increase the number of PMOS transistors that are in the driven state so that the differential value Di reaches the target differential value Dt.

Thus, the differential value Di can accommodate a wide range of target differential value Dt, and the switching can be performed while both suppressing conductive noise and radiation noise and reducing a switching loss.

Second Embodiment

The switching of the semiconductor switching element 1 has been described in the first embodiment, but in the fall of the semiconductor switching element 1, the semiconductor switching element 1 may be switched to the driven state again due to influence of noise or the like after the semiconductor switching element 1 has been switched to the non-driven state and despite a period in which the semiconductor switching element 1 should be in the non-driven state.

In the present embodiment, an electronic circuit for preventing the semiconductor switching element 1 from being unintentionally switched to the driven state again will be described. A configuration of an electronic circuit 200 of the present embodiment will be described with reference to FIG. 11. The same components as those of the electronic circuit 100 are denoted with the same reference numerals, and the description thereof is omitted.

Figure 11:
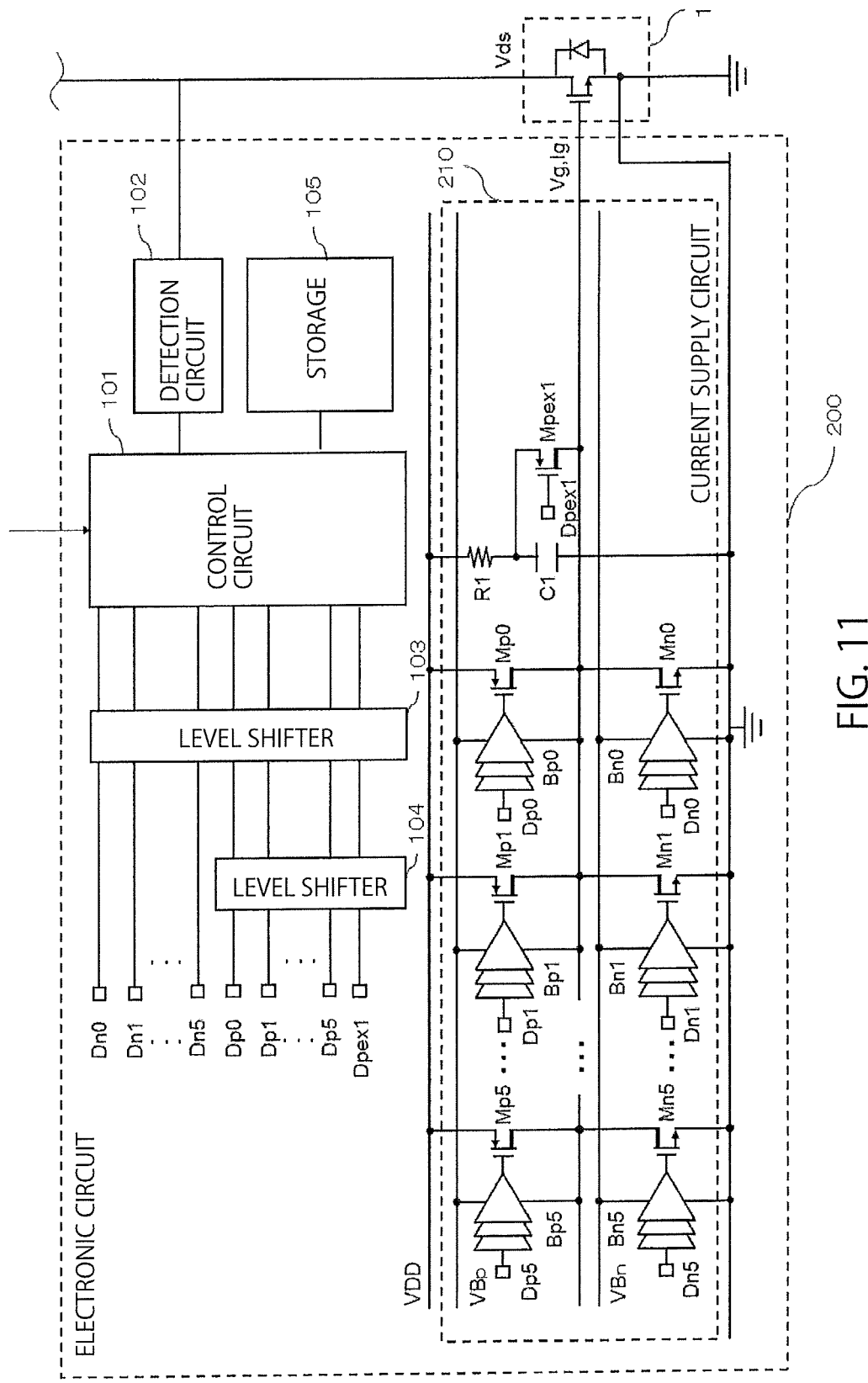
FIG. 11 is a driving system diagram including a configuration of an electronic circuit 200 in a second embodiment.

A current supply circuit 210 further includes, in addition to the current supply circuit 110, a resistor R1, a capacitor C1, and a p-type transistor. As illustrated in FIG. 11, the p-type transistor is represented as a PMOS transistor Mpex1, but may be another p-type PMOS transistor which has been described in the first embodiment. Although not illustrated in FIG. 11, a buffer can be provided between the PMOS transistor Mpex1 and a connection point Dpex1.

The resistor R1 is connected to the power supply potential VDD, and the capacitor C1 and the PMOS transistor Mpex 1 are connected in parallel, and are connected to the resistor R1. The capacitor C1 is further connected to the reference potential, and the PMOS transistor Mpex1 is further connected to the gate terminal of the semiconductor switching element 1.

The impedance of the resistor R1 is higher than the impedance of the PMOS transistor Mpex1 that is in the driven state.

The capacitance of the capacitor C1 varies depending on the semiconductor switching element 1. The internal structure of the semiconductor switching element 1 will be described with reference to FIG. 12. A resistor and a capacitor generated by a physical structure exist in the semiconductor switching element 1. This resistor is also referred to as a parasitic resistor, and this capacitor is also referred to as a parasitic capacitor.

Figure 12:
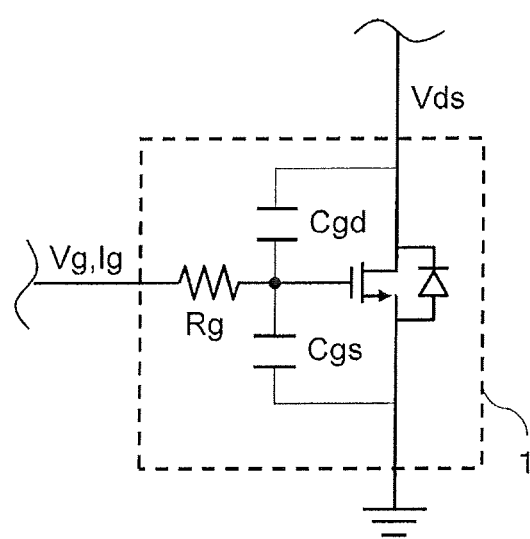
FIG. 12 is a diagram for illustrating resistor and capacitance generated by a physical structure of the semiconductor switching element 1.

FIG. 12 illustrates a parasitic resistor Rg, a parasitic capacitor Cgd generated between the gate terminal and the drain terminal, and a parasitic capacitor Cgs generated between the gate terminal and the source terminal.

In the present embodiment, the capacitance of the capacitor C1 is determined from the capacitance of the parasitic capacitor Cgd, the capacitance of the parasitic capacitor Cgs, and a threshold voltage Vth of the semiconductor switching element 1. The capacitance of the capacitor C1 may be determined from any one of the capacitance of the parasitic capacitor Cgd and the capacitance of the parasitic capacitor Cgs, and the threshold voltage Vth of the semiconductor switching element 1.

Note that the impedance of the parasitic resistor Rg, and the capacitance of the parasitic capacitor Cgd, and the capacitance of the parasitic capacitor Cgs in the semiconductor switching element 1 can be measured by the existing method.

The voltage for driving the PMOS transistor Mpex1 is input to the PMOS transistor Mpex1 from the control circuit 101 through the level shifters 103 and 104 and the connection point Dpex1.

In the same manner as the first embodiment, the operations of the control circuit 101 and the current supply circuit 210 in the switching of the semiconductor switching element 1 will be described. Note that the first to fourth rises and falls and the fifth rise (FIG. 3 through FIG. 7) which have been described in the first embodiment are the same as those in the first embodiment, and thus description thereof will be omitted. The operations of the control circuit 101 and the current supply circuit 210 in the fifth fall (FIG. 7) of the semiconductor switching element 1, which has been described in the first embodiment, will be described. Note that the control circuit 101 determines the NMOS transistors to be in the non-driven state in the fourth fall and in a partial time slot in the fifth fall of the semiconductor switching element 1, and further the PMOS transistor Mpex1 to be in the driven state in this partial time slot, and causes the storage 105 to store the information on the determined transistors.

The control circuit 101 causes the PMOS transistors that are in the driven state to be in the non-driven state at the time t10a, and causes the NMOS transistors to be in the driven state at the time t10b in the same manner as FIG. 3 to FIG. 6. The driving force Wns of the NMOS transistors at this time is "Wns1."

At the time t10c, the control circuit 101 causes the NMOS transistors that are in the driven state to be in the non-driven state based on the information stored in the storage 105 in the fourth fall of the semiconductor switching element 1. Furthermore, at the time t10d, the control circuit 101 causes the PMOS transistor Mpex1 to be in the driven state based on the information stored in the storage 105 in the same manner. The driving force Wps of the PMOS transistor at this time is "Wps3." As illustrated in FIG. 7, the control circuit 101 causes the NMOS transistors to be in the non-driven state in a time slot from the time t10b to the time t10d, and causes the PMOS transistor Mpex1 to be driven in the time slot from the time t10d to the time t10e.

As described in the first embodiment, since the driving force of the NMOS transistors becomes zero and the PMOS transistor is in the driven state, the change in the voltage Vds becomes more gentle. The relationship between the differential value D5 and the target differential value Dt is represented as D5=Dt. The control circuit 101 causes the storage 105 to store the information on the transistor that is in the driven state and the time slot in which the transistor is in the driven state in this fall, to use the information for the next and subsequent falls.

Unlike the first embodiment, when the control circuit 101 causes the PMOS transistor Mpex1 to be in the driven state, charge is supplied from the capacitor C1, and the current flows in the gate terminal of the semiconductor switching element 1. When the charge is lost from this capacitor C1, the current stops flowing to the gate terminal of the semiconductor switching element 1. Accordingly, the semiconductor switching element 1 can be prevented from being switched to the driven state again due to influence of noise or the like after the semiconductor switching element 1 has been switched to the non-driven state.

Then, the control circuit 101 causes the PMOS transistors to be in the non-driven state at the time t10e, and causes the NMOS transistors to be in the driven state at the time t10f so that the driving force Wns of the NMOS transistors becomes "Wns1."

Note that charging of the capacitor C1 is performed from the power supply potential VDD through the resistor R1 while the voltage Vds is not transition. The transition of the voltage Vds refers to the case where the voltage Vds is changed to a predetermined degree or more. For example, in FIG. 7, the change of the voltage Vds from Vds1 to zero in the time slot t9 is expressed as the transition of the voltage Vds. The change of the voltage Vds from zero to Vds1 in the time slot t10 is expressed as the transition of the voltage Vds.

As described above, the control circuit 101 performs the fall of the semiconductor switching element 1.

The present embodiment has been described above. Also in the present embodiment, a modified example can also be variously implemented and practiced. The modified examples described in the first embodiment can be implemented and practiced.

Figure 13:
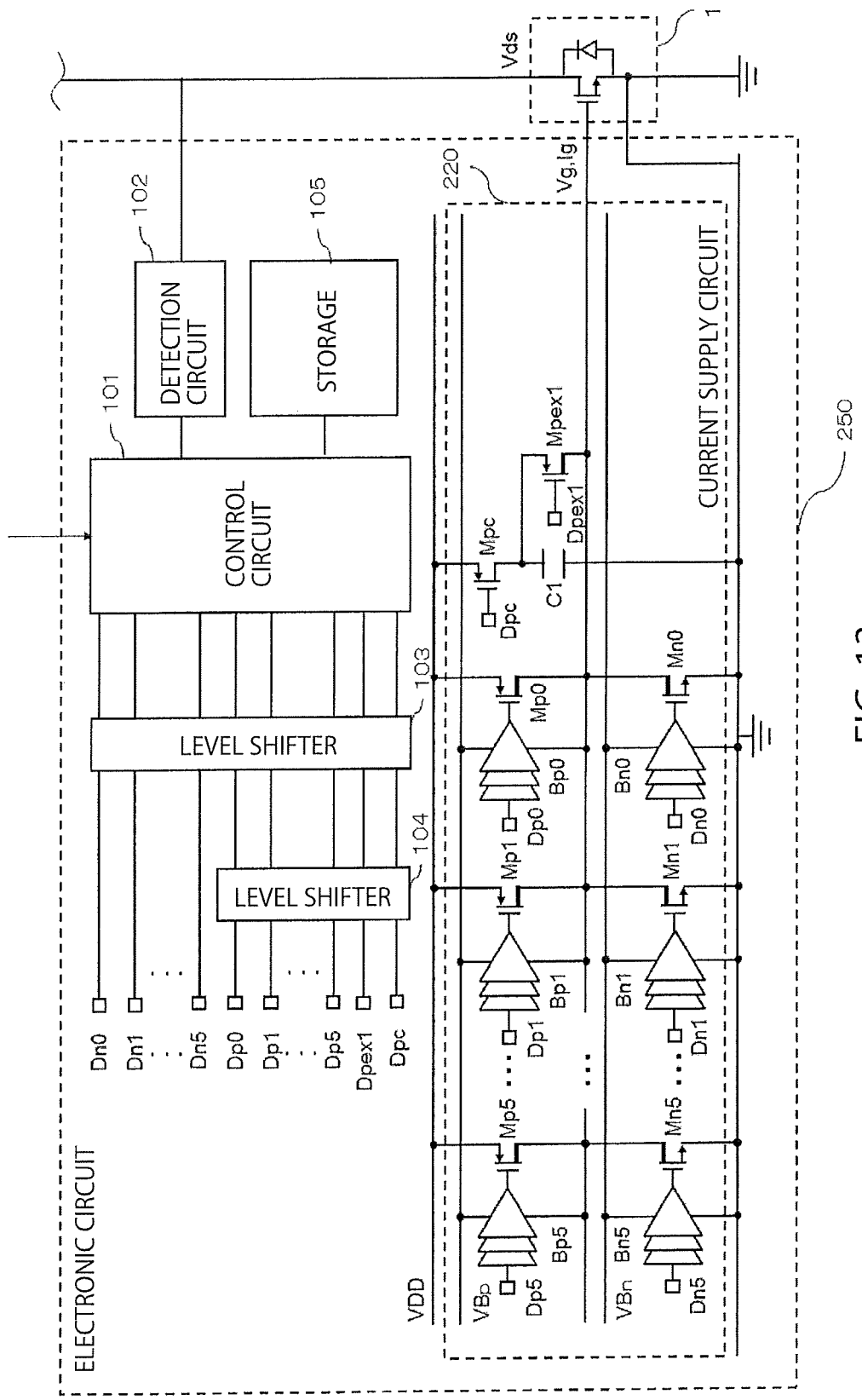
FIG. 13 is a driving system diagram including a configuration of an electronic circuit 250 applicable to the second embodiment.

In the present embodiment, the resistor R1 is provided for charging the capacitor C1. A p-type transistor may be provided in place of the resistor R1. A configuration of an electronic circuit 250 provided with the p-type transistor in place of the resistor R1 will be described with reference to FIG. 13. The electronic circuit 250 is different from the electronic circuit 200 in the current supply circuit. The other components are the same as those in the electronic circuit 200, and are denoted with the same reference numerals, and the description thereof is omitted.

A current supply circuit 220 is different from the current supply circuit 210 in that the PMOS transistor Mpc is provided as the p-type transistor in place of the resistor R1. The PMOS transistor Mpc may be another p-type transistor which has been described in the first embodiment. Although not illustrated in FIG. 13, a buffer can be provided between the PMOS transistor Mpc and a connection point Dpc.

The contacts of the drain terminal and source terminal of the PMOS transistor Mpc are the same as those of the resistor R1. The gate terminal of the PMOS transistor Mpc is connected to the control circuit 101 through the connection point Dpc and the level shifters 103 and 104. That is, the PMOS transistor Mpc is switched to the driven state in response to the voltage output from the control circuit 101.

The PMOS transistor Mpc is provided for charging the capacitor C1, and is switched to the driven state in response to the voltage output from the control circuit 101 while the semiconductor switching element 1 is in the driven state, to thereby charge the capacitor C1.

The control circuit 101 can determine the timing when the capacitor C1 is charged, by changing the resistor R1 to the PMOS transistor Mpc. Since the impedance of the resistor R1 is higher than the impedance of the PMOS transistor Mpex1 that is in the driven state, the capacitor C1 can be more easily charged by changing the resistor R1 to the PMOS transistor Mpc.

Figure 14:
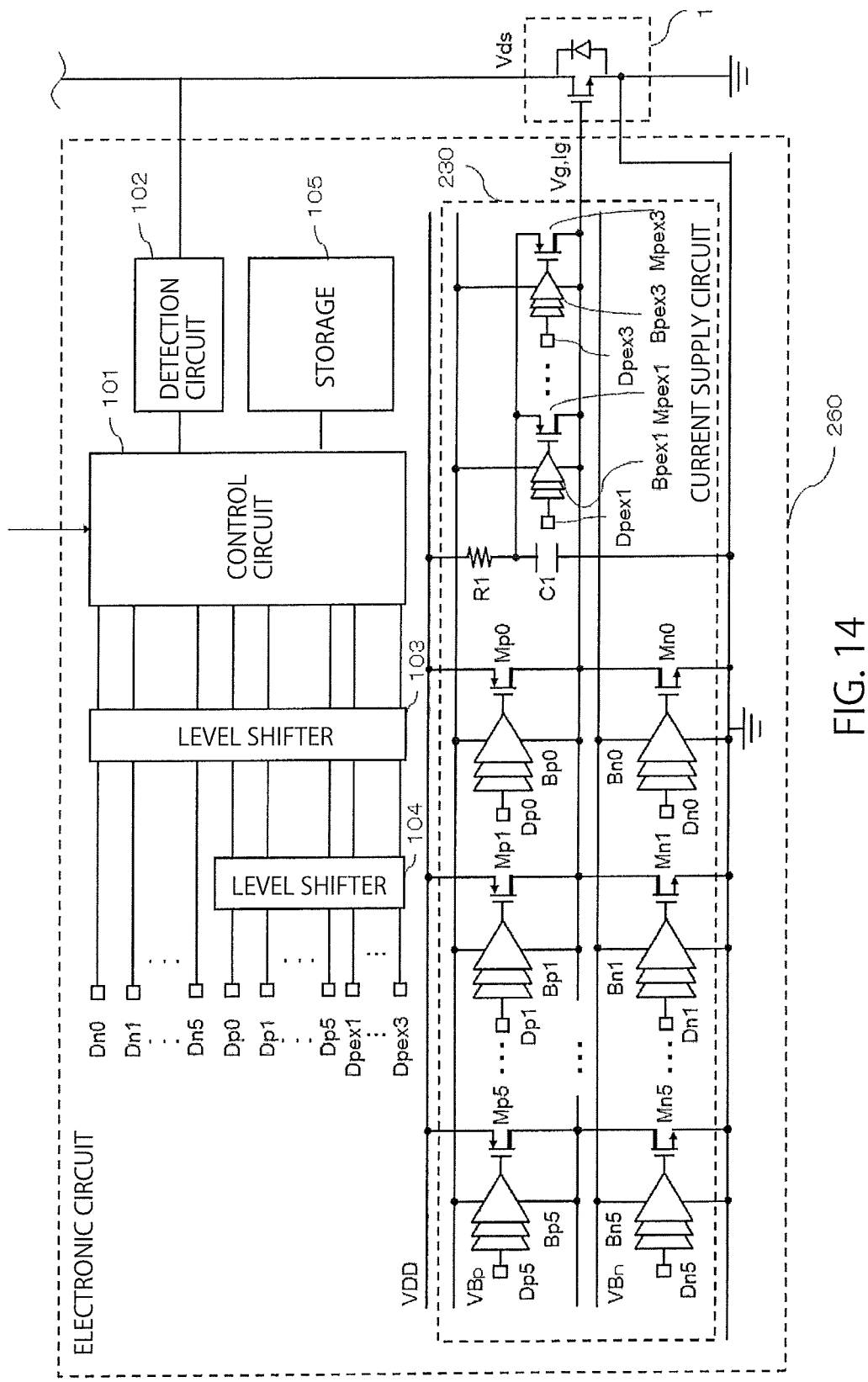
FIG. 14 is a driving system diagram including a configuration of an electronic circuit 260 applicable to the second embodiment.

In the present embodiment, the number of PMOS transistors Mpex1 is only one in FIG. 11, but a plurality of PMOS transistors Mpex1 can be provided. Such a configuration of an electronic circuit 260 is illustrated in FIG. 14.

That is, in a current supply circuit 230 of the electronic circuit 260, the capacitor C1 and the plurality of PMOS transistors Mpexk (k is an integer of 1 or more) are connected in parallel and are connected to the resistor R1. In FIG. 14, as k=3, three PMOS transistors Mpexk are provided. Here, the number of PMOS transistors Mpexk and the driving force Wpexk of the PMOS transistors Mpexk can be arbitrarily set. The other components are the same, and are denoted with the same reference numerals, and the description thereof is omitted.

In the same manner as the PMOS transistor Mpx, the gate terminal of the PMOS transistor Mpexk is also connected to the corresponding buffer Bpexk. The PMOS transistor Mpexk is connected to the control circuit 101 through the connection point Dpexk and the level shifters 103 and 104. That is, the PMOS transistor Mpexk is switched to the driven state in response to the voltage output from the control circuit 101.

Since the plurality of PMOS transistors Mpexk are connected to the capacitor C1 in parallel, the driving force Wps of the PMOS transistors which has been described in the first embodiment can be variously set. The case where the differential value Di reaches the target differential value Dt by causing the PMOS transistor Mpex1 to be in the driven state has been described in the present embodiment, but providing the plurality of PMOS transistors Mpexk enables accommodating various target differential values Dt.

As described above, the current supply circuit further includes the resistor R1, the capacitor C1, and new p-type transistors, in which the capacitor C1 and the new p-type transistors are connected in parallel and are connected to the resistor R1, thereby preventing the semiconductor switching element 1 from being unintentionally switched to the driven state again in the fall of the semiconductor switching element 1 in addition to the effects described in the first embodiment. A plurality of new p-type transistors may be provided or the resistor R1 may be a p-type transistor.

Third Embodiment

The switching of the semiconductor switching element 1 has been described in the first embodiment, but in the rise of the semiconductor switching element 1, the semiconductor switching element 1 may be switched to the non-driven state again due to influence of noise or the like after the semiconductor switching element 1 has been switched to the driven state and despite a period in which the semiconductor switching element 1 should be in the driven state.

In the present embodiment, an electronic circuit for preventing the semiconductor switching element 1 from being unintentionally switched to the non-driven state again will be described. A configuration of an electronic circuit 300 of the present embodiment will be described with reference to FIG. 15. The same components as those of the electronic circuit 100 are denoted with the same reference numerals, and the description thereof is omitted.

Figure 15:
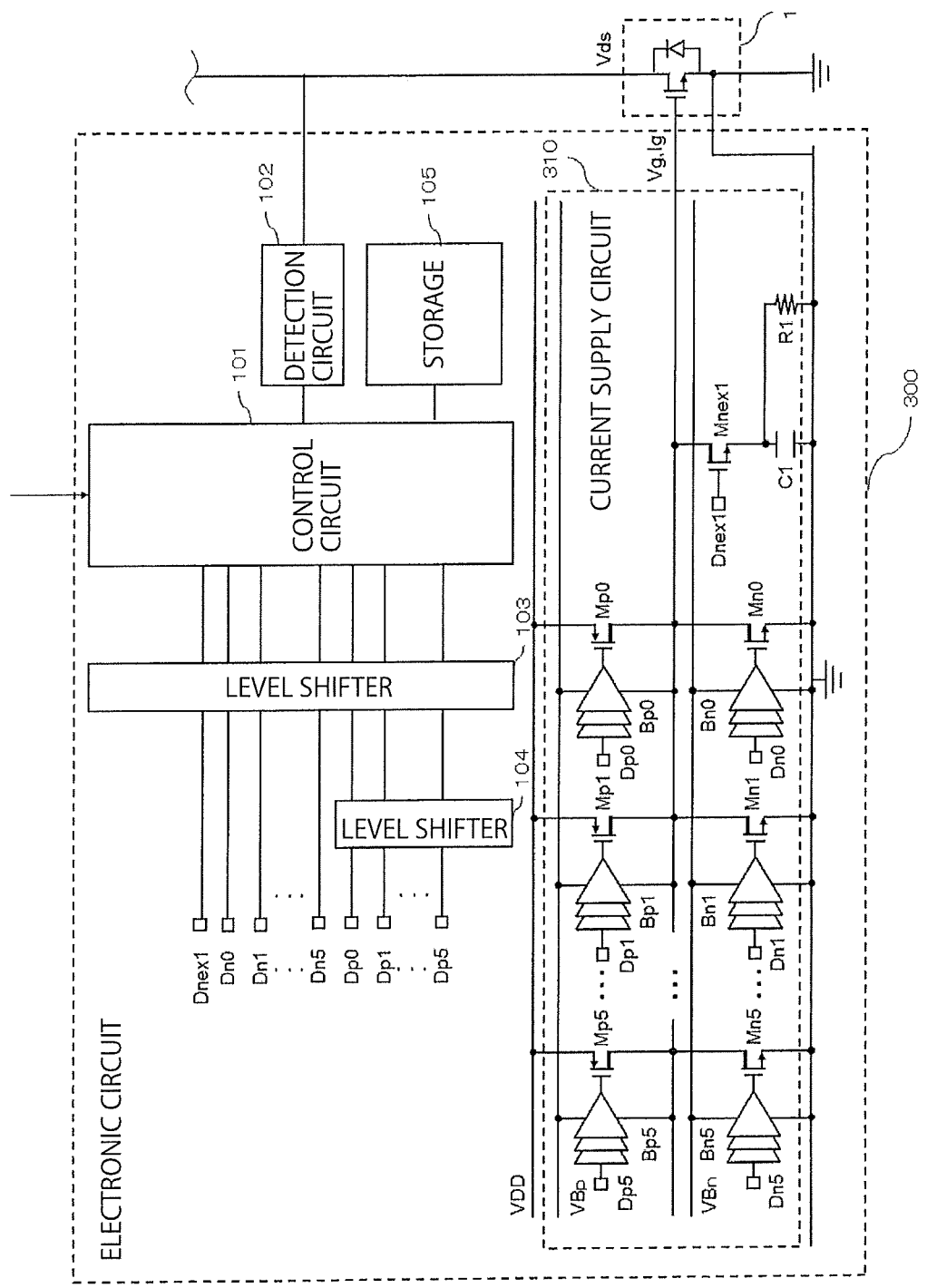
FIG. 15 is a driving system diagram including a configuration of an electronic circuit 300 in a third embodiment.

A current supply circuit 310 further includes, in addition to the current supply circuit 110, a resistor R1, a capacitor C1, and an n-type transistor. As illustrated in FIG. 15, the n-type transistor is represented as an NMOS transistor Mnex1, but may be another n-type transistor which has been described in the first embodiment. Although not illustrated in FIG. 15, a buffer can be provided between the NMOS transistor Mnex1 and a connection point Dnex1.

The NMOS transistor Mnex1 is connected to the gate terminal of the semiconductor switching element 1, and the capacitor C1 and the resistor R1 are connected in parallel and are connected to the NMOS transistor Mnex1 and the reference potential.

The impedance of the resistor R1 is higher than the impedance of the NMOS transistor Mnex1 that is in the driven state.

As described in the second embodiment, the capacitance of the capacitor C1 is determined from the capacitance of the parasitic capacitor Cgd, the capacitance of the parasitic capacitor Cgs, and the threshold voltage Vth of the semiconductor switching element 1. The capacitance of the capacitor C1 may be determined from any one of the capacitance of the parasitic capacitor Cgd and the capacitance of the parasitic capacitor Cgs, and the threshold voltage Vth of the semiconductor switching element 1.

FIG. 15 illustrates the resistor R1 and the capacitor C1, but they may be the same as those described in the second embodiment or different from those described in the second embodiment.

The voltage for driving the NMOS transistor Mnex1 is input to the NMOS transistor Mnex1 from the control circuit 101 through the level shifters 103 and the connection point Dnex1.

In the same manner as the first embodiment, the operations of the control circuit 101 and the current supply circuit 310 in the switching of the semiconductor switching element 1 will be described. Note that the first to fourth rises and falls (FIG. 3 through FIG. 6) which have been described in the first embodiment are the same as those in the first embodiment, and thus description thereof will be omitted. The operations of the control circuit 101 and the current supply circuit 310 in the fifth rise (FIG. 7) of the semiconductor switching element 1, which has been described in the first embodiment, will be described.

The control circuit 101 determines the PMOS transistors to be in the non-driven state in each of a partial time slot in the fourth rise and a partial time slot in the fifth rise of the semiconductor switching element 1, and further the NMOS transistor Mnex1 to be in the driven state in this partial time slot, and causes the storage 105 to store the information on the determined transistors.

The control circuit 101 causes the NMOS transistors that are in the driven state to be in the non-driven state at the time t9a, and causes the PMOS transistors to be in the driven state at the time t9b in the same manner as FIG. 3 to FIG. 6. The driving force Wps of the PMOS transistors at this time is "Wps1."

At the time t9c, the control circuit 101 causes the PMOS transistors that are in the driven state to be in the non-driven state based on the information stored in the storage 105 in the fourth rise of the semiconductor switching element 1. Furthermore, at the time t9d, the control circuit 101 causes the NMOS transistor Mnex1 to be in the driven state based on the information stored in the storage 105 in the same manner. The driving force Wns of the NMOS transistor at this time is "Wns3." As illustrated in FIG. 7, the control circuit 101 causes the PMOS transistors to be in the non-driven state in a time slot from the time t9c to the time t9f, and causes the NMOS transistor Mnex1 to be driven in the time slot from the time t9d to the time t9e.

As described in the first embodiment, since the driving force of the PMOS transistors becomes zero and the NMOS transistor is in the driven state, the change in the voltage Vds becomes more gentle. The relationship between the differential value D5 and the target differential value Dt is represented as D5=Dt. The control circuit 101 causes the storage 105 to store the information on the transistor that is in the driven state and the time slot in which the transistor is in the driven state in this rise, to use the information for the next and subsequent rises.

Unlike the first embodiment, when the control circuit 101 causes the NMOS transistor Mnex1 to be in the driven state, charge is supplied from the capacitor C1, and the current flows in the gate terminal of the semiconductor switching element 1. When the charge is lost from this capacitor C1, the current stops flowing to the gate terminal of the semiconductor switching element 1. Accordingly, the semiconductor switching element 1 can be prevented from being switched to the non-driven state again due to influence of noise or the like after the semiconductor switching element 1 has been switched to the driven state.

Then, the control circuit 101 causes the NMOS transistors to be in the non-driven state at the time t9e, and causes the PMOS transistors to be in the driven state at the time t9f so that the driving force Wps of the PMOS transistors becomes "Wps1."

Note that charging of the capacitor C1 is performed from the power supply potential VDD through the resistor R1 while the voltage Vds does not transition, as described in the second embodiment.

As described above, the control circuit 101 performs the rise of the semiconductor switching element 1.

The present embodiment has been described above. Also in the present embodiment, a modified example can also be variously implemented and practiced. The modified examples described in the first embodiment can be implemented and practiced.

Figure 16:
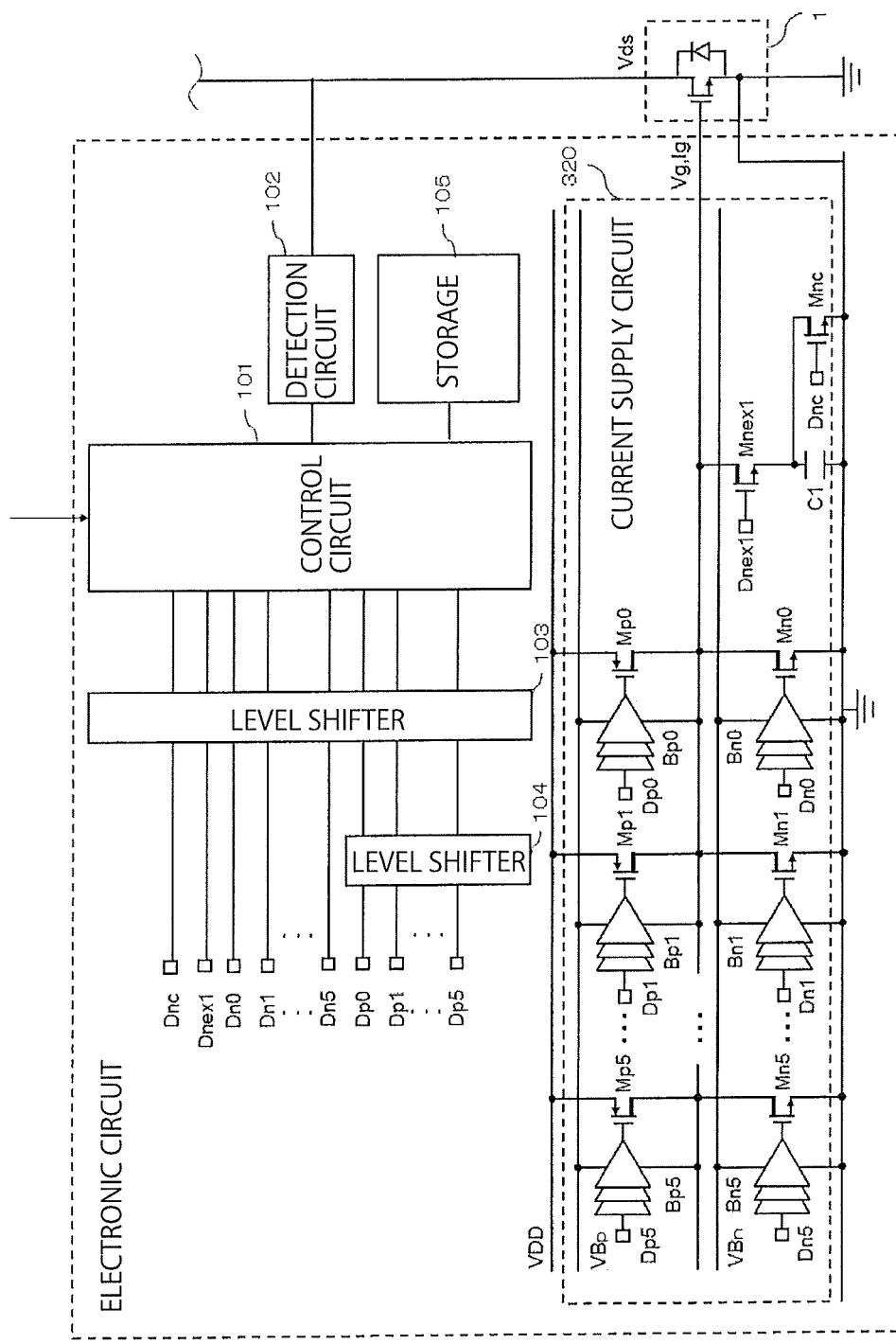
FIG. 16 is a driving system diagram including a configuration of an electronic circuit 350 applicable to the third embodiment.

In the present embodiment, the resistor R1 is provided for charging the capacitor C1. An n-type transistor may be provided in place of the resistor R1. A configuration of an electronic circuit 350 provided with the n-type transistor in place of the resistor R1 will be described with reference to FIG. 16. The electronic circuit 350 is different from the electronic circuit 300 in the current supply circuit. The other components are the same as those in the electronic circuit 300, and are denoted with the same reference numerals, and the description thereof is omitted.

A current supply circuit 320 is different from the current supply circuit 310 in that the NMOS transistor Mnc is provided as the n-type transistor in place of the resistor R1. The NMOS transistor Mnc may be another n-type transistor which has been described in the first embodiment. Although not illustrated in FIG. 16, a buffer can be provided between the NMOS transistor Mnc and a connection point Dnc.

The contacts of the drain terminal and source terminal of the NMOS transistor Mnc are the same as those of the resistor R1. The gate terminal of the NMOS transistor Mnc is connected to the control circuit 101 through the connection point Dnc and the level shifter 103. That is, the NMOS transistor Mnc is switched to the driven state in response to the voltage output from the control circuit 101.

The NMOS transistor Mnc is provided for charging the capacitor C1, and is switched to the driven state in response to the voltage output from the control circuit 101 while the semiconductor switching element 1 is in the driven state, to thereby charge the capacitor C1.

The control circuit 101 can determine the timing when the capacitor C1 is charged, by changing the resistor R1 to the NMOS transistor Mnc. Since the impedance of the resistor R1 is higher than the impedance of the NMOS transistor Mnex1 that is in the driven state, the capacitor C1 can be more easily charged by changing the resistor R1 to the NMOS transistor Mnc.

Figure 17:
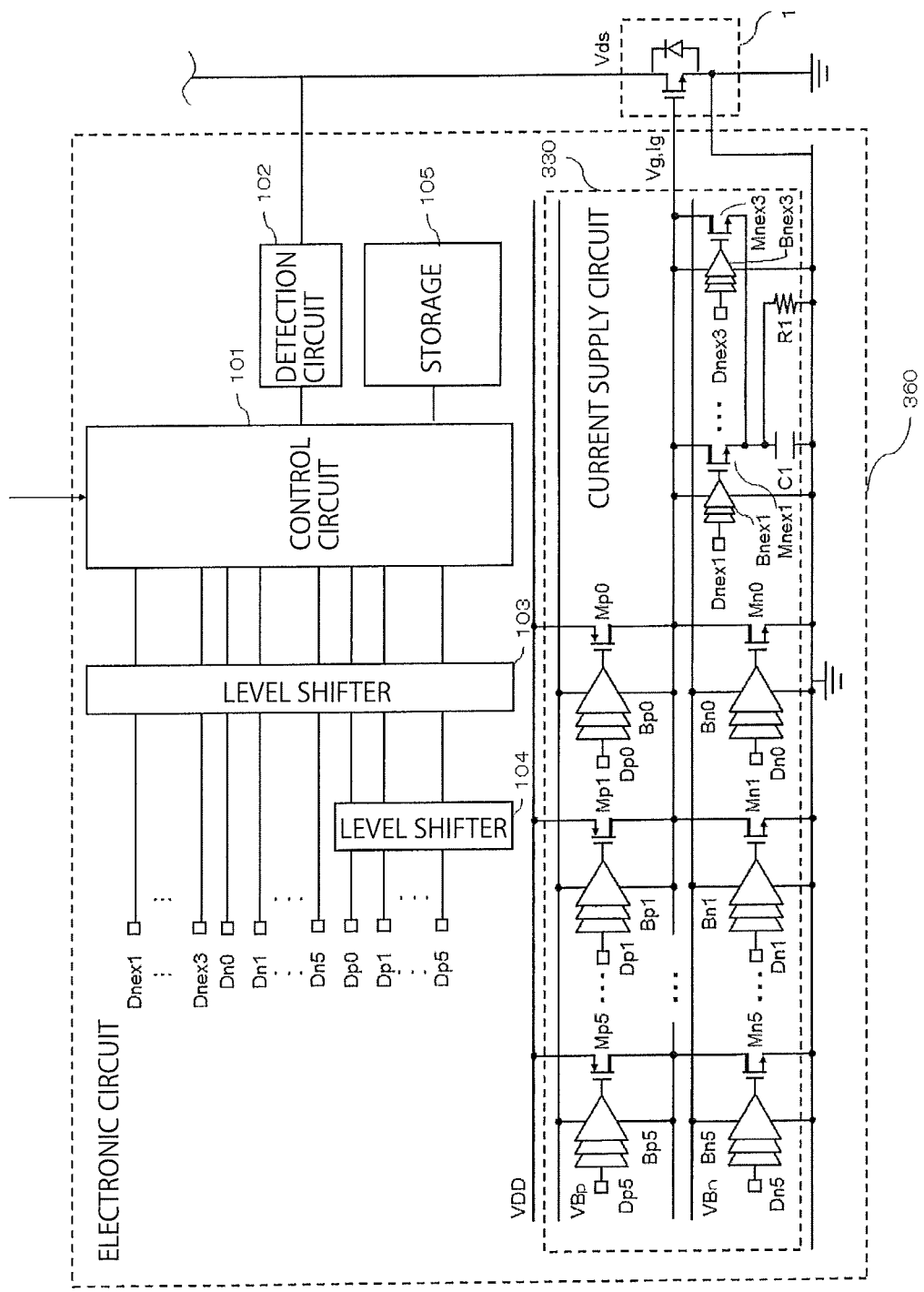
FIG. 17 is a driving system diagram including a configuration of an electronic circuit 360 applicable to the third embodiment.

In the present embodiment, the number of NMOS transistors Mnex1 is only one in FIG. 15, but a plurality of NMOS transistors Mnex 1 can be provided. Such a configuration of an electronic circuit 360 is illustrated in FIG. 17. That is, in a current supply circuit 330 of the electronic circuit 360, the capacitor C1 and the plurality of NMOS transistors Mnexk (k is an integer of 1 or more) are connected in parallel and are connected to the resistor R1 and the capacitor C1. In FIG. 14, as k=3, three NMOS transistors Mnexk are provided. Here, the number of NMOS transistors Mnexk and the driving force Wnexk of the NMOS transistors Mnexk can be arbitrarily set. The other components are the same, and are denoted with the same reference numerals, and the description thereof is omitted.

In the same manner as the NMOS transistor Mnx, the gate terminal of the NMOS transistor Mnexk is also connected to the corresponding buffer Bnexk. The NMOS transistor Mnexk is connected to the control circuit 101 through the connection point Dnexk and the level shifter 103. That is, the NMOS transistor Mnexk is switched to the driven state in response to the voltage output from the control circuit 101.

Since the plurality of NMOS transistors Mnexk are connected to the resistor R1 and the capacitor C1 in parallel, the driving force Wns of the NMOS transistors which has been described in the first embodiment can be variously set. The case where the differential value Di reaches the target differential value Dt by causing the NMOS transistor Mnex1 to be in the driven state has been described in the present embodiment, but providing the plurality of NMOS transistors Mnexk enables accommodating various target differential values Dt.

Figure 18:
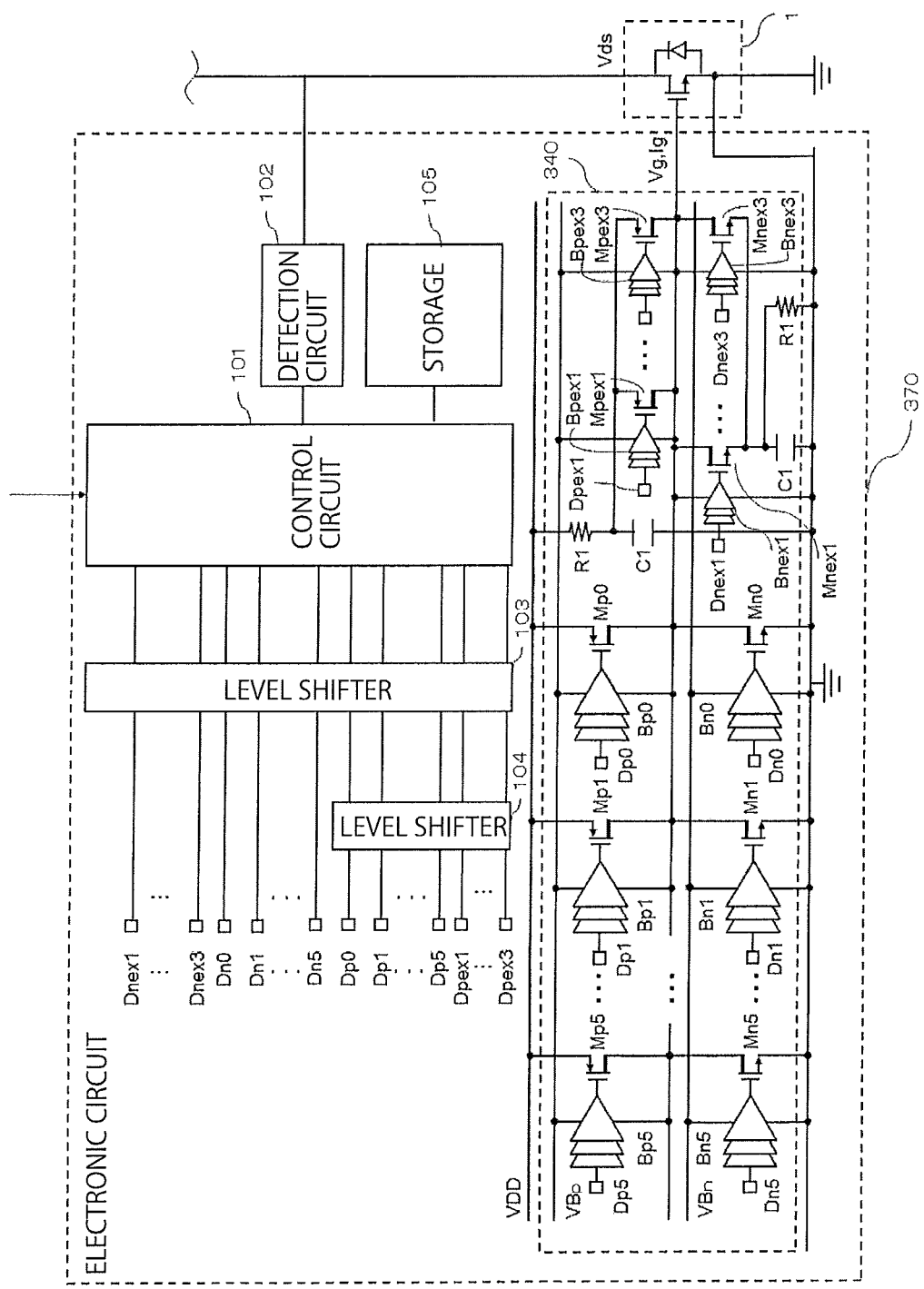
FIG. 18 is a driving system diagram including a configuration of an electronic circuit 370 applicable to the third embodiment.

The electronic circuits 200, 250, and 260 which have been described in the second embodiment may be combined with the electronic circuits 300, 350, and 360 which have been described in the present embodiment. For example, an electronic circuit 370 illustrated in FIG. 18 may be configured by a combination of the electronic circuit 260 and the electronic circuit 360. The connection relationship of the current supply circuit 340 in the electronic circuit 370 is obtained by a combination of the current supply circuit 230 in the electronic circuit 260 and the current supply circuit 330 in the electronic circuit 360.

As described above, the current supply circuit further includes the resistor R1, the capacitor C1, and new n-type transistors, in which the capacitor C1 and the new n-type transistors are connected in parallel and are connected to the resistor R1, thereby preventing the semiconductor switching element 1 from being unintentionally switched to the driven state again in the rise of the semiconductor switching element 1 in addition to the effects described in the first embodiment. A plurality of new n-type transistors may be provided or the resistor R1 may be an n-type transistor.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. An electronic circuit that switches a state of a semiconductor switching element between a driven state and a non-driven state, comprising:

a current supply circuit including at least one first n-type transistor and at least one first p-type transistor and supply a current to a control terminal of the semiconductor switching element;
a detection circuit configured to acquire a value associated with a voltage at a first terminal different from the control terminal of the semiconductor switching element; and
a control circuit configured to perform at least one of (i) and (ii) based on the value associated with the voltage,
(i) causing the first n-type transistors to be in the non-driven state during a first period and causing at least one of the first p-type transistors to be in the driven state during a second period within the first period to switch the state of the semiconductor switching element from the driven state to the non-driven state, and
(ii) causing the first p-type transistors to be in the non-driven state during a third period and causing at least one of the first n-type transistors to be in the driven state during a fourth period within the third period to switch the state of the semiconductor switching element from the non-driven state to the driven state.

2. The electronic circuit according to claim 1, wherein the value associated with the voltage is a time differential value of the voltage at the first terminal,
the control circuit determines transistors to be in the driven state from among the first p-type transistors based on the time differential value and a target differential value, and
the target differential value is a predetermined value on which the time differential value targets in switching of the semiconductor switching element.

3. The electronic circuit according to claim 1, wherein the value associated with the voltage is a time differential value of the voltage at the first terminal,
the control circuit determines transistors to be in the driven state from among the first n-type transistors based on the time differential value and a target differential value, and
the target differential value is a predetermined value on which the time differential value targets in switching of the semiconductor switching element.

4. The electronic circuit according to claim 1, wherein the current supply circuit includes a first capacitor and at least one second p-type transistor that are electrically connected in parallel, the second p-type transistor is electrically connected to the control terminal, and
the control circuit causes the first n-type transistors to be in the non-driven state and causes the second p-type transistors to be in the driven state, based on the value associated with the voltage, to switch the state of the semiconductor switching element from the driven state to the non-driven state.

5. The electronic circuit according to claim 4, wherein charge stored in the first capacitor is determined from at least one of two capacitances and a threshold voltage of the semiconductor switching element, the two capacitances comprising a first capacitance between the control terminal and the first terminal and a second capacitance between the first terminal and a second terminal connected to a reference potential in the semiconductor switching element.

6. The electronic circuit according to claim 4, wherein the current supply circuit includes a first resistor or a third p-type transistor, the first resistor or the third p-type transistor is electrically connected to the power supply voltage and the first capacitor, and the first capacitor is charged through the first resistor or the third p-type transistor.

7. The electronic circuit according to claim 6, wherein the first capacitor is charged while a voltage at the first terminal is not changed to a predetermined degree or more.

8. The electronic circuit according to claim 1, wherein the current supply circuit includes a second capacitor that is connected to the reference potential and at least one second n-type transistor that is connected to the second capacitor and the control terminal, and the control circuit causes the first p-type transistors to be in the non-driven state and causes the second n-type transistors to be in the driven state, based on the value associated with the voltage, to switch the state of the semiconductor switching element from the driven state to the non-driven state.

9. The electronic circuit according to claim 8, wherein charge stored in the second capacitor is determined from at least one of two capacitances and a threshold voltage of the semiconductor switching element, the two capacitances comprising a first capacitance between the control terminal and the first terminal and a second capacitance between the first terminal and a second terminal connected to a reference potential in the semiconductor switching element.

10. The electronic circuit according to claim 8, wherein the current supply circuit includes a second resistor or a third n-type transistor, the second resistor or the third n-type transistor is electrically connected to the reference potential, and is electrically connected in parallel with the second capacitor and in series with the second n-type transistor, and the second capacitor is charged through the second resistor or the third n-type transistor.

11. The electronic circuit according to claim 10, wherein the second capacitor is charged while a voltage at the first terminal is not changed to a predetermined degree or more.

12. The electronic circuit according to claim 1, further comprising:

a storage configured to store first information on transistors to be in the driven state in switching of the semiconductor switching element, wherein the control circuit causes the transistors to be in the driven state based on the first information.

13. The electronic circuit according to claim 12, further comprising:

a temperature sensor configured to measure a temperature of the semiconductor switching element to output the temperature to the control circuit, wherein the first information is information defining transistors to be in the driven state by the temperature, and the control circuit causes the transistor to be in the driven state based on the temperature and the first information.

14. A method, comprising:

supplying a current to a control terminal of a semiconductor switching element from at least on first n-type transistor and at least one first p-type transistor;

acquiring a value associated with a voltage at a first terminal different from the control terminal of the semiconductor switching element; and performing at least one of (i) and (ii) based on the value associated with the voltage, (i) causing the first n-type transistors to be in the non-driven state during a first period and causing at least one of the first p-type transistors to be in the driven state during a second period within the first period to switch the state of the semiconductor switching element from the driven state to the non-driven state, and (ii) causing the first p-type transistors to be in the non-driven state during a third period and causing at least one of the first n-type transistors to be in the driven state during a fourth period within the third period to switch the state of the semiconductor switching element from the non-driven state to the driven state.

15. A non-transitory recording medium in which a program is stored to make a control circuit to execute a method comprising:

supplying a current to a control terminal of a semiconductor switching element from at least on first n-type transistor and at least one first p-type transistor;

acquiring a value associated with a voltage at a first terminal different from the control terminal of the semiconductor switching element; and performing at least one of (i) and (ii) based on the value associated with the voltage, (i) causing the first n-type transistors to be in the non-driven state during a first period and causing at least one of the first p-type transistors to be in the driven state during a second period within the first period to switch the state of the semiconductor switching element from the driven state to the non-driven state, and (ii) causing the first p-type transistors to be in the non-driven state during a third period and causing at least one of the first n-type transistors to be in the driven state during a fourth period within the third period, to switch the state of the semiconductor switching element from the non-driven state to the driven state.

16. The electronic circuit according to claim 1, wherein the first n-type transistor is electrically connected to a reference potential and the control terminal, and the first p-type transistor is electrically connected to a power supply potential and the control terminal.

* * * * *